(12) United States Patent  
Ukigaya

(10) Patent No.: US 11,387,299 B2  
(45) Date of Patent: Jul. 12, 2022

(54) DISPLAY DEVICE, ELECTRONIC APPARATUS, AND DISPLAY DEVICE MANUFACTURING METHOD

(71) Applicant: CANON KABUSHIKI KAISHA, Tokyo (JP)

(72) Inventor: Nobutaka Ukigaya, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 10 days.

(21) Appl. No.: 16/823,148

(22) Filed: Mar. 18, 2020

(65) Prior Publication Data

US 2020/0219951 A1 Jul. 9, 2020

Related U.S. Application Data

(63) Continuation of application No. 16/134,810, filed on Sep. 18, 2018, now Pat. No. 10,636,851.

(30) Foreign Application Priority Data

Sep. 28, 2017 (JP) ................................ 2017-188934

(51) Int. Cl.
*H01L 27/32* (2006.01)
*H01L 51/50* (2006.01)
(Continued)

(52) U.S. Cl.
CPC ...... *H01L 27/3246* (2013.01); *H01L 27/3244* (2013.01); *H01L 27/3258* (2013.01); *H01L 51/5012* (2013.01); *H01L 51/5056* (2013.01); *H01L 51/5088* (2013.01); *H01L 51/56* (2013.01); *H01L 27/322* (2013.01); *H01L 27/3218* (2013.01); *H01L 27/3272* (2013.01); *H01L 51/5209* (2013.01);
(Continued)

(58) Field of Classification Search
CPC ............. H01L 27/3246; H01L 27/3244; H01L 27/3258; H01L 27/3272; H01L 51/5012; H01L 51/5056; H01L 51/5088; H01L 51/56; H01L 51/5218; H01L 2227/323
USPC .......................................................... 257/40
See application file for complete search history.

(56) References Cited

U.S. PATENT DOCUMENTS 6,091,078 A * 7/2000 Codama .............. H01L 27/3283  
                                                                     257/40  
2004/0066136 A1* 4/2004 Yoneda ............... H01L 27/3258  
                                                        313/505

(Continued)

FOREIGN PATENT DOCUMENTS

JP       2012-216338 A    11/2012

*Primary Examiner* — Dzung Tran  
(74) *Attorney, Agent, or Firm* — Canon U.S.A., Inc. I.P. Division

(57) ABSTRACT

An embodiment provides a display device including an insulating layer which is continuous between opposed ends of two adjacent lower electrodes from an upper part of one of the ends to an upper part of the other end, a first organic layer which is disposed over the lower electrodes and the insulating layer, a second organic layer which is disposed over the lower electrodes and the insulating layer with the first organic layer interposed therebetween and includes a light emitting layer, and a second electrode which covers the organic layer. The upper face of the insulating layer includes a recess between the two lower electrodes. The aspect ratio of the recess is 0.5 or more.

20 Claims, 22 Drawing Sheets

(51) Int. Cl.
  *H01L 51/56*  (2006.01)
  *H01L 51/52*  (2006.01)

(52) U.S. Cl.
  CPC ...... *H01L 51/5218* (2013.01); *H01L 51/5253* (2013.01); *H01L 51/5265* (2013.01); *H01L 2227/323* (2013.01); *H01L 2251/53* (2013.01); *H01L 2251/5315* (2013.01); *H01L 2251/558* (2013.01); *H01L 2924/12044* (2013.01)

(56) References Cited

U.S. PATENT DOCUMENTS

| | | | |
|---|---|---|---|
| 2014/0175469 A1* | 6/2014 | Dozen | H01L 27/3246 257/89 |
| 2016/0293888 A1* | 10/2016 | Shim | H01L 51/5228 |
| 2017/0271421 A1* | 9/2017 | Jinbo | H01L 51/5253 |
| 2018/0123081 A1* | 5/2018 | Baik | H01L 51/5209 |
| 2019/0386248 A1* | 12/2019 | Itonaga | G09F 9/30 |

* cited by examiner t1 = t2 t1 < t2 t1 > t2

DISPLAY DEVICE, ELECTRONIC APPARATUS, AND DISPLAY DEVICE MANUFACTURING METHOD

CROSS REFERENCE TO RELATED APPLICATIONS

The present application is a continuation of U.S. patent application Ser. No. 16/134,810, filed on Sep. 18, 2018, entitled "DISPLAY DEVICE, ELECTRONIC APPARATUS, AND DISPLAY DEVICE MANUFACTURING METHOD", the content of which each application is expressly incorporated by reference herein in its entirety, and which further claims priority from Japanese Patent Application No 2017-188934, filed Sep. 28, 2017, that of which is also hereby incorporated by reference herein in its entirety.

BACKGROUND OF THE INVENTION

Field of the Invention

The disclosure relates to a display device, an electronic apparatus, and a display device manufacturing method.

Description of the Related Art

For example, there is an organic light emitting display device as a display device. An organic light emitting element of the organic light emitting display device generates light by recombination of electrons injected from a cathode with holes injected from an anode in an organic light emitting layer. The generated light is extracted from the cathode side or the anode side.

In an active matrix display device using an organic light emitting element, a pixel drive circuit which includes a drive transistor and a multilayer wiring structure is formed on a substrate, and organic light emitting elements are arrayed on the substrate. As such a display device, there is known a top emission display device which uses a light transmissive conductive material as a cathode. The top emission display apparatus reflects light generated in an organic light emitting layer by an anode, and extracts the light from the cathode side.

As pixels of a display device using organic light emitting elements have become denser in recent years, a problem of leakage current through an organic layer which is provided commonly between adjacent pixels which are close to each other has come to light. Accordingly, a non-light emitting pixel slightly emits light due to the influence from a light emitting pixel, which causes color mixture or reduction in efficiency.

As a method for coping with the above problem, US 2012/0248475 (hereinafter, PTL1) is disclosed. In PTL 1, a groove is formed on an insulating layer which is disposed between organic light emitting elements to reduce the film thickness of a hole injection layer or a hole transport layer, which is an organic layer having a low resistance, inside the groove. As an embodiment disclosed in PTL 1, when insulating layers are laminated between the organic light emitting elements, a groove which penetrates the laminated insulating layers is formed.

In the method for controlling leakage current described in PTL 1 by using the groove which penetrates a first insulating layer and a second insulating layer, an interface formed between the first insulating layer and the second insulating layer is in contact with the organic layer in the groove. Thus, current may leak inside the organic layer through the interface according to a potential gradient along the interface.

SUMMARY OF THE INVENTION

One aspect of the present embodiment relates to a display device. An example display device may include a first lower electrode and a second lower electrode both disposed over a first insulating layer. A second insulating layer is disposed between the first lower electrode and the second lower electrode, on an end of the first lower electrode, and on an end of the second lower electrode. A first organic layer is disposed over the first lower electrode, the second insulating layer, and the second lower electrode. A second organic layer disposed over the first organic layer and including a light emitting layer. An upper electrode is disposed over the second organic layer.

In a section passing through the first lower electrode, the second lower electrode, the first organic layer, the second organic layer, and the upper electrode, the second insulating layer includes a first part located on the end of the first lower electrode, a second part located on the end of the second lower electrode, and a third part continuous from the first part to the second part, an upper face of the third part of the second insulating layer includes a recess between the first lower electrode and the second lower electrode, and a length of the recess in a first direction in which the first lower electrode is laminated on the first insulating layer is 0.5 times or more a length of the recess in a second direction perpendicular to the first direction.

Another aspect of the disclosure relates to another example display device. The display device may include a first lower electrode and a second lower electrode both disposed over a first insulating layer. A second insulating layer is disposed between the first lower electrode and the second lower electrode, on an end of the first lower electrode, and on an end of the second lower electrode. A first organic layer is disposed over the first lower electrode, the second insulating layer, and the second lower electrode. A second organic layer is disposed over the first organic layer and including a light emitting layer; and an upper electrode disposed over the second organic layer.

In a section passing through the first lower electrode, the second lower electrode, the first organic layer, the second organic layer, and the upper electrode, the second insulating layer includes a first part located on the end of the first lower electrode, a second part located on the end of the second lower electrode, and a third part continuous from the first part to the second part, an upper face of the third part of the second insulating layer includes a recess between the first lower electrode and the second lower electrode, and a cavity is present inside the recess between the third part of the second insulating layer and the first organic layer.

Still another aspect of the disclosure relates to an example display device manufacturing method. The method includes forming a first insulating layer; forming a first lower electrode and a second lower electrode over the first insulating layer; removing part of the first insulating layer between the first lower electrode and the second lower electrode to form a recess on the first insulating layer; forming a second insulating layer over the first lower electrode, the first insulating layer, and the second lower electrode, the second insulating layer being continuous from an upper part of an end of the first lower electrode to an upper part of an end of the second lower electrode through the recess of the first insulating layer and being in contact with the recess of the first insulating layer; forming a first organic layer over the first lower electrode, the second insulating layer, and the second lower electrode; forming a second organic layer including a light emitting layer over the first lower electrode, the second insulating layer, and the second lower electrode with the first organic layer interposed therebetween; and forming an upper electrode over the first lower electrode, the second insulating layer, and the second lower electrode with the first organic layer and the second organic layer interposed therebetween.

Another aspect of the disclosure provides a display device that includes insulating layers laminated between adjacent organic light emitting elements and has reduced leakage current through an interface between the insulating layers.

Further features and aspects of the present disclosure will become apparent from the following description of example embodiments (with reference to the attached drawings).

DESCRIPTION OF THE EMBODIMENTS

Hereinbelow, a display device according to an embodiment of the disclosure will be described in detail with reference to the drawings. The following embodiments are examples of the disclosure. Values, shapes, materials, elements, and an arrangement and a connection form of the elements in the embodiments do not limit the disclosure. In the following embodiments, the anode and the cathode described above correspond to a first electrode and a second electrode, respectively.

First Example Embodiment

Figure 1:
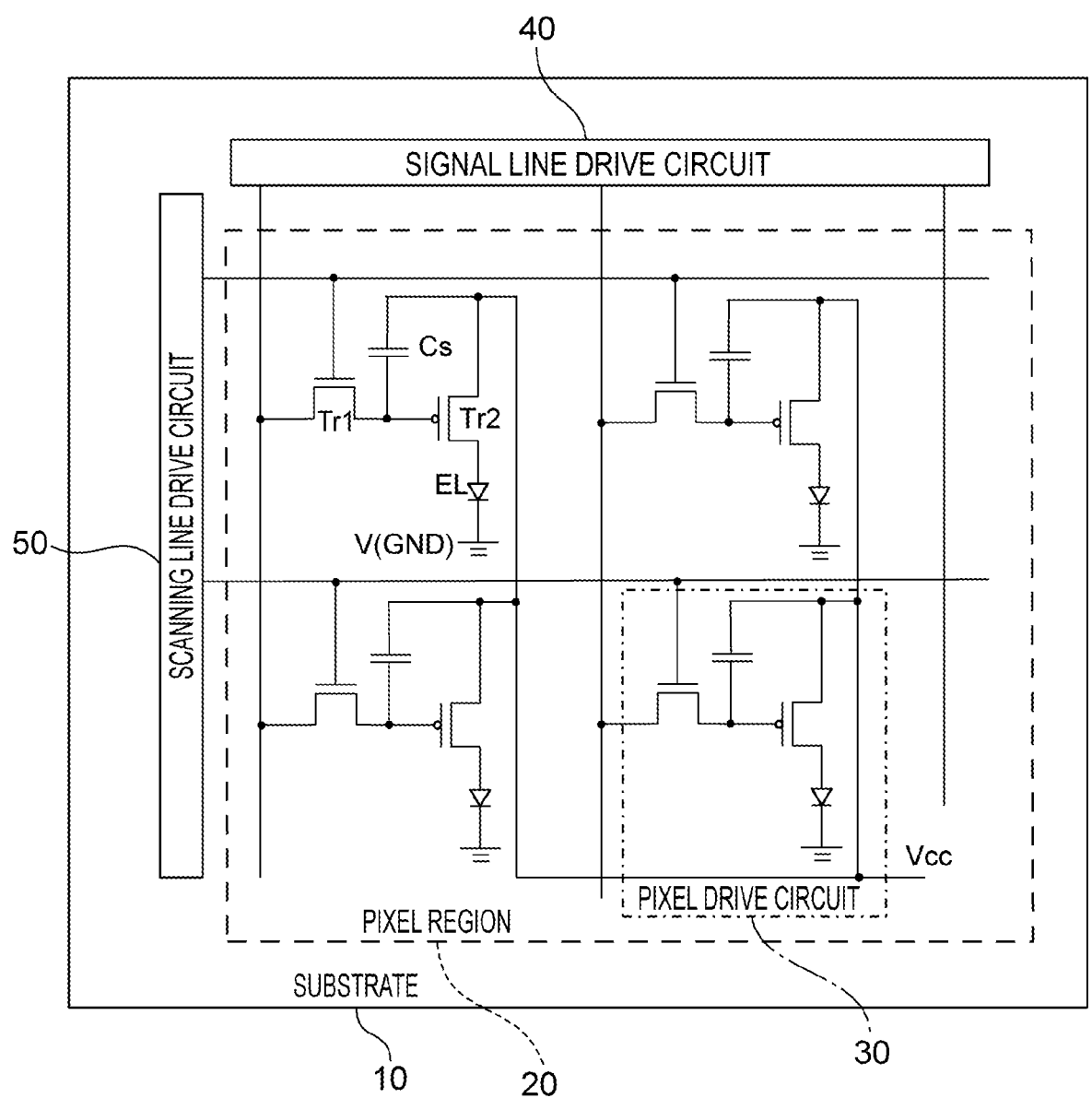
FIG. 1 is an equivalent circuit diagram of an example of a display device according to a first embodiment.

FIGS. 1 to 8B illustrate the configuration of a display device according to the present embodiment. FIG. 1 is an equivalent circuit diagram of an example of the display device. A plurality of light emitting elements EL are arrayed in a pixel region 20 which is laid out on a substrate 100. Each of the light emitting elements EL corresponds to, for example, a sub-pixel 2 of red, green, or blue. A peripheral circuit region is disposed around the pixel region 20. The peripheral circuit region is provided with, for example, a signal line drive circuit 40 and a scanning line drive circuit 50 which are drivers for video display.

A plurality of sub-pixels 2 are arranged in the pixel region 20. Each of the sub-pixels 2 includes, for example, a pixel drive circuit 30 and a light emitting element EL. The pixel drive circuit 30 is an active drive circuit which is disposed in a layer lower than a first electrode (described below). The pixel drive circuit 30 includes, for example, a writing transistor Tr1, a drive transistor Tr2, and a holding capacitor Cs.

The light emitting element EL is connected in series to the drive transistor Tr2 between a first power line (Vcc) and a second power line (Vgnd). For example, an organic light emitting element can be used as the light emitting element EL. One electrode of the holding capacitor Cs is connected between the drive transistor Tr2 and the writing transistor Tr1, and the other electrode thereof is connected to the first power line (Vcc).

In the sub-pixel 2, a plurality of signal lines are arranged in a column direction, and a plurality of scanning lines are arranged in a row direction. An intersection point of each of the signal lines with each of the scanning lines corresponds to any one of the light emitting elements EL.

Each of the signal lines is connected to the signal line drive circuit 40 which is disposed in the peripheral circuit region. An image signal is supplied to a source electrode of the writing transistor Tr1 from the signal line drive circuit 40 through the signal line. Each of the scanning lines is connected to the scanning line drive circuit 50 which is disposed in the peripheral circuit region. Scanning signals are sequentially supplied to a gate electrode of the writing transistor Tr1 from the scanning line drive circuit 50 through the scanning line.

Figure 2:
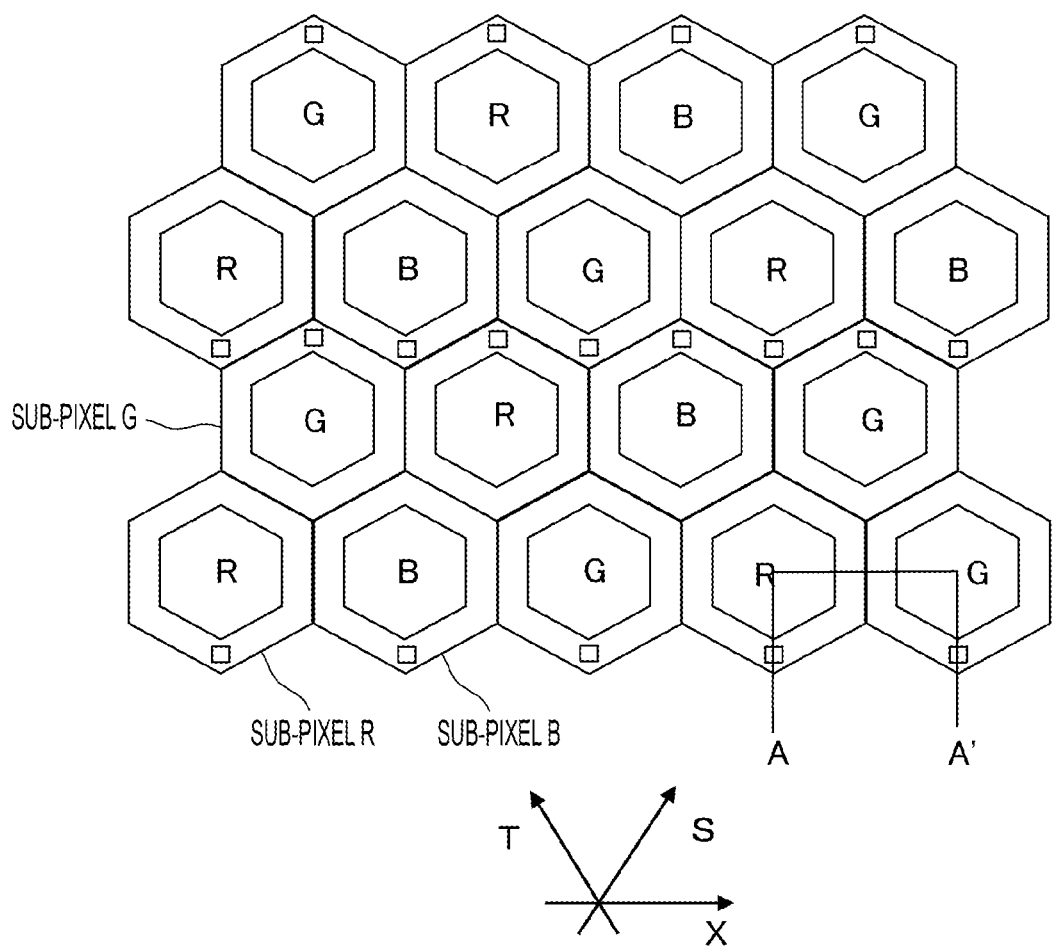
FIG. 2 is a plan view of a pixel region of an example of the display device according to the first embodiment.

FIG. 2 is a planar structure diagram of part of the pixel region according to the present embodiment. The plurality of light emitting elements EL are arrayed in a delta form on the substrate 100. Adjacent light emitting elements EL correspond to pixels representing different colors. Here, sub-pixels 2 which emit red light, green light, and blue light are referred to as a sub-pixel R, a sub-pixel G, and a sub-pixel B, respectively.

The pixel array form described herein is an example. The pixel array form may be a matrix form or another array form. The pixels of the respective colors described herein have the same area. However, the pixels of the respective colors may have different areas taking into consideration a resolution and a light emission efficiency of the display device. In FIG. 2, the sub-pixel 2 has a hexagonal shape which is suitable for high-density arrangement. The shape of the sub-pixel 2 described herein is not limited to a hexagon, and may be appropriately selected from quadrangles such as a square and a rectangle, other polygons, and circles, or a combination thereof.

Three adjacent light emitting elements EL correspond to three sub-pixels which constitute one pixel. FIG. 2 illustrates an example in which the red sub-pixel R and the blue sub-pixel B are adjacent to each other in a direction X, and the red sub-pixel R and the green sub-pixel G are adjacent to each other in a direction S. The blue sub-pixel B and the green sub-pixel G are adjacent to each other in a direction T. A pitch of the sub-pixels 2 is, for example, approximately 5 μm. The direction X, the direction S, and the direction T are different from each other. In the present embodiment, an angle between the direction X, the direction S, and the direction T is 60°.

The present embodiment describes an example in which three sub-pixels 2 constitute one pixel. However, the number of sub-pixels 2 constituting one pixel is not limited to three. For example, each pixel may include two green sub-pixels G so that one pixel includes four sub-pixels 2 according to the resolution of the display device. Alternatively, for example, each pixel may include a white sub-pixel W so that one pixel includes four sub-pixels 2 according to the efficiency of the display device. The pitch of the sub-pixels 2 or a pixel pitch is not limited to the above pitch, and can be set to any pitch according to a pixel density required for the display device.

Each of the light emitting elements EL includes a plug 103 which is connected to the pixel drive circuit 30. In FIG. 2, in two rows of sub-pixels 2, plugs 103 in the first row are disposed on the upper side in FIG. 2, and plugs 103 in the second row are disposed on the lower side in FIG. 2. Although the light emitting elements EL of the sub-pixels 2 are arrayed in a delta form in FIG. 2, the pixel drive circuits 30 are often arrayed in a matrix form. Thus, the positions of the plugs 103 are changed according to rows to shorten the length of wiring for connecting the light emitting elements EL to the pixel drive circuits 30. Accordingly, it is possible to reduce the area occupied by the wiring. Further, it is possible to improve flexibility in alignment taking into consideration leakage with another wiring or a parasitic capacitance.

Figure 3:
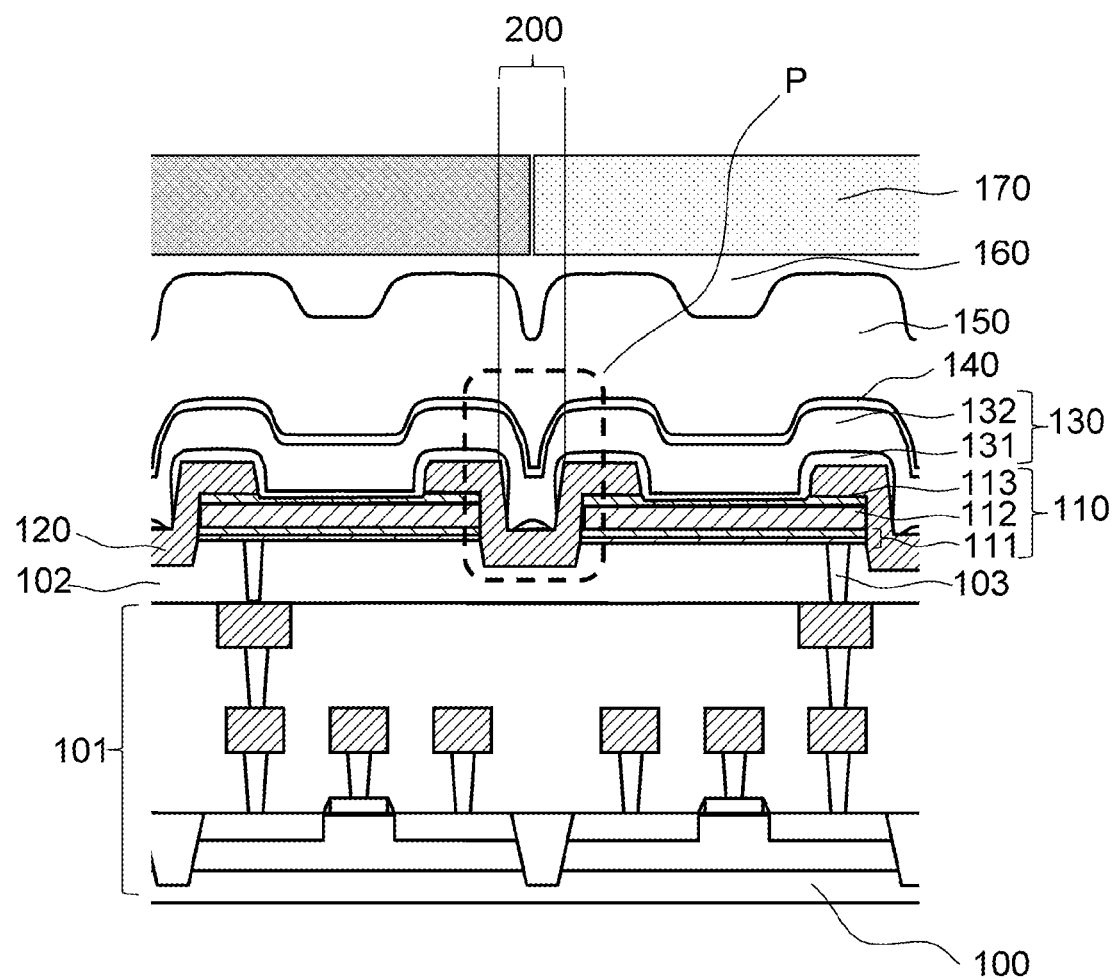
FIG. 3 is a sectional view of an organic light emitting element of an example of the display device according to the first embodiment.

FIG. 3 is a sectional structure diagram taken along line A-A' which extends across two adjacent sub-pixels illustrated in FIG. 2. As described above, there are the pixel region and the peripheral circuit region on the substrate 100, and the pixel region includes the light emitting elements EL, an optical system 210, and a drive circuit layer 101 which includes the pixel drive circuit 30 corresponding to each of the light emitting elements EL. The drive circuit layer 101 includes the writing transistor Tr1, the drive transistor Tr2, the holding capacitor Cs, and a wiring layer. Further, the drive circuit layer 101 may appropriately include a light shielding layer which reduces stray light to each of the transistors.

A first insulating layer 102, which is planarized, is disposed over the drive circuit layer 101. The light emitting elements EL described above are disposed over the first insulating layer 102. The light emitting element EL is, for example, an organic light emitting element, and has a structure in which a first electrode 110 as a lower electrode (here, an anode), a second insulating layer 120, an organic layer 130, and a second electrode 140 as an upper electrode (here, a cathode) are laminated in this order.

The organic layer 130 includes an organic layer 131 which includes at least either a hole injection layer or a hole transport layer and an organic layer 132 which includes a light emitting layer. The organic layer 131 is disposed over the first electrode 110 and the second insulating layer 120. The organic layer 132 is disposed over the first electrode 110 and the second insulating layer 120 with the organic layer 131 interposed therebetween. The second electrode 140 is disposed over the first electrode 110 and the second insulating layer 120 with the organic layer 131 and the organic layer 132 interposed therebetween.

The upper face of the second insulating layer 120 includes a recess 200 between adjacent first electrodes 110 (a range P surrounded by a broken line in the drawing). Thus, the organic layer 131 which is disposed over the second insulating layer 120 locally includes a thin-film part inside the recess 200. Alternatively, the organic layer 131 may include a discontinuous part (locally intermittent part) inside the recess 200. Accordingly, it is possible to increase the resistance of the organic layer 131 between the light emitting elements. As a result, it is possible to reduce or prevent leakage current which propagates from the first electrode 110 through the organic layer 131 and flows between the organic light emitting elements or to an adjacent organic light emitting element.

The film thickness and the area of the part having a locally reduced film thickness inside the recess 200 can be appropriately adjusted. Although an example of the organic layer 131 has been described above, the other organic layer 132 may also have nonuniform film thickness in a similar manner.

The surface of the first insulating layer 102 between the first electrodes 110 is exposed to plasma in an etching process for the first electrodes 110, and may thus have a lower density than the density of a deep part. An interface between the low-density surface of the first insulating layer 102 and the second insulating layer 120 which is disposed over the low-density surface is likely to have a defect (a low-density part), and has a low insulating property relative to the inside of the insulating layer. This is considered as one of the causes of leakage current on the interface between the first insulating layer 102 and the second insulating layer 120.

Such leakage current causes slight light emission in a non-light emitting pixel or between pixels due to the influence from a light emitting pixel, which results in color mixture and reduction in efficiency.

Such a malfunction becomes worse when densification (higher resolution) of pixels of the display device is performed. For example, when densification is performed in PTL 1, the distance between the first electrode and the groove is reduced. Accordingly, a resistance component on an interface between a first insulating film 21 and a second insulating film 22 becomes small, and a malfunction caused by leakage current through the interface becomes worse.

Thus, in the present embodiment, the interface between the first insulating layer 102 and the second insulating layer 120 is configured not to be in contact with the organic layer 131.

Figure 4:
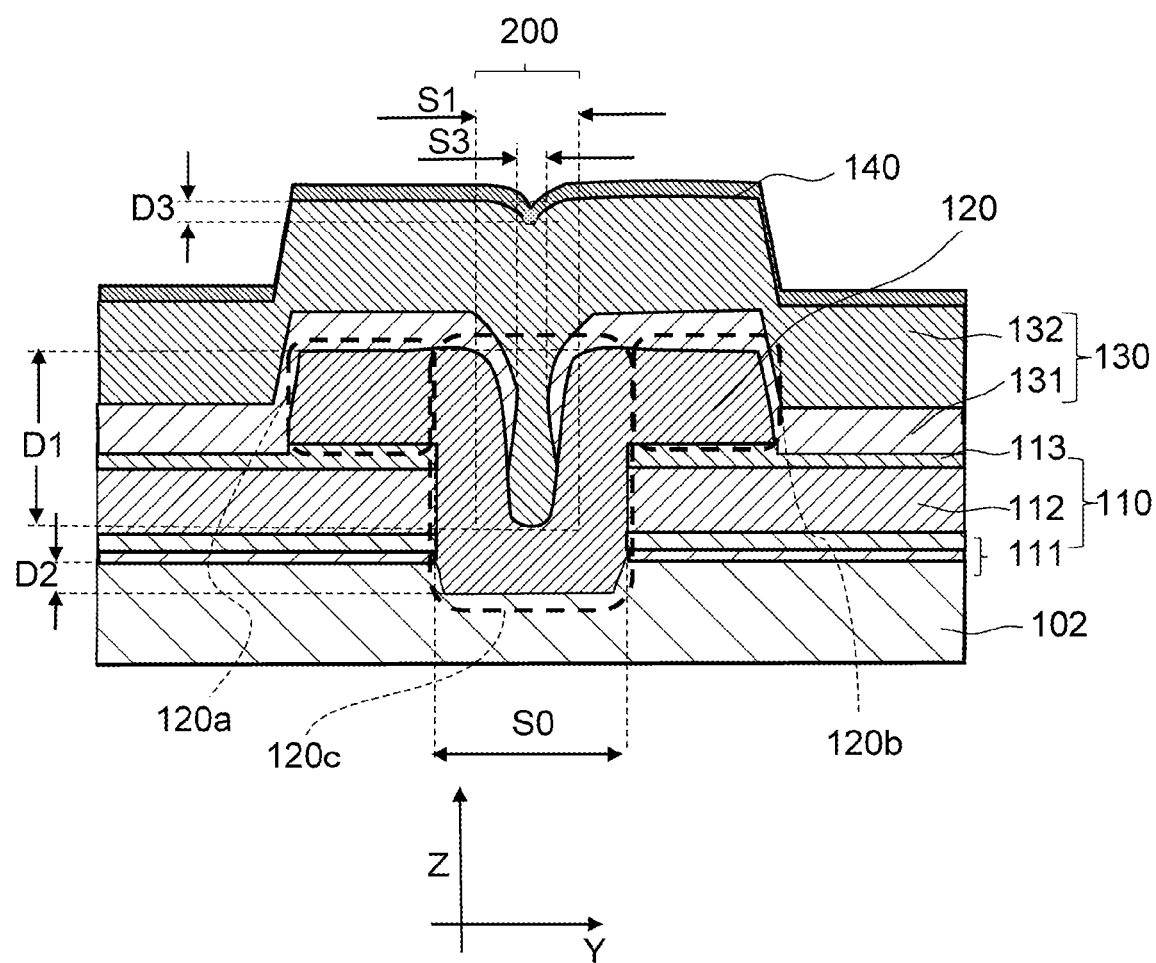
FIG. 4 is a sectional view of a pixel portion of an example of the display device according to the first embodiment.

FIG. 4 is an enlarge view of part of FIG. 3 in a section passing through the first electrode 110, the organic layer 130, and the second electrode 140. In order to increase the resistance of the organic layer 131 inside the recess 200 to reduce leakage current, an aspect ratio of the recess 200 is preferably 0.5 or more. That is, a length D1 of the recess 200 in a direction Z in which the first electrode 110 is laminated on the first insulating layer 102 is preferably 0.5 times or more a length S1 of the recess 200 in a direction Y which is perpendicular to the lamination direction Z. Further, the length D1 of the recess 200 in the direction Z in which the first electrode 110 is laminated on the first insulating layer 102 is more preferably equal to or more than the length S1 of the recess 200 in the direction Y perpendicular to the lamination direction Z.

In FIG. 4, the second insulating layer 120 is disposed between adjacent first electrodes 110. The second insulating layer 120 includes an opening over each of the first electrodes 110. Thus, in the section of FIG. 3, the second insulating layer 120 includes a first part 120a which is disposed on an end of the first electrode 110 (left side), a second part 120b which is disposed on an end of the first electrode 110 (right side), and a third part 120c which is continuous from the first part 120a to the second part 120b. The first part 120a and the second part 120b overlap the first electrodes 110 in plan view. The third part 120c does not overlap the first electrodes 110 in plan view.

In this manner, the second insulating layer 120 is continuous between the opposed ends of the adjacent first electrodes 110 from an upper part of one of the ends to an upper part of the other end. That is, the second insulating layer 120 covers the opposed ends of the adjacent first electrodes 110 and the upper face of the first insulating layer 102 between the opposed ends. That is, even when the upper face of the second insulating layer 120 includes the recess 200, the organic layer 131 which is disposed over the second insulating layer 120 is not in contact with the interface between the first insulating layer 102 and the second insulating layer 120. Thus, the interface between the first insulating layer 102 and the second insulating layer 120 does not become a leak path between the first electrodes 110 and the organic layer 131.

In FIG. 3, the organic light emitting element is protected by a moisture-proof layer 150 which is disposed over the second electrode 140. A planarized layer 160 and a color filter layer 170 are disposed over the moisture-proof layer 150. Although the color filter layer 170 described herein is laminated on the moisture-proof layer 150, the disclosure is not limited thereto. Further, a black matrix (light shielding unit) may be disposed between pixels in the color filter layer 170.

As another form, the color filter layer 170 may be disposed on another substrate which is opposed to the above substrate, and these substrates may be bonded together. When the substrates are bonded together in this manner, a moisture-proof material can be disposed on the other substrate. Thus, a moisture-proof layer may not be laminated on the second electrode as described above.

The display device is a so-called top emission display device which, for example, extracts light generated in the organic layer 132 from the side of the second electrode 140.

In a top emission display device, an anode having a high reflectivity is used to form a cavity structure. In the cavity structure, the film thickness of each organic layer is defined by a light emission wavelength and set to satisfy a multiple interference condition. Accordingly, it is possible to improve the efficiency of extracting light to the outside and control an emission spectrum.

For example, aluminum, silver, or an alloy thereof can be used as a conductive material having a high reflectivity. Further, aluminum and an alloy thereof can be preferably used for micromachining. Further, it is possible to achieve a structure that enhances the cavity effect or improve a carrier injection performance by forming a conductive material having a high transmittance on a reflective metal.

In the display device illustrated in FIG. 3, the organic layer 132 includes the light emitting layer which is common between the organic light emitting elements. The organic layer 131 which includes the hole injection layer or the hole transport layer is not patterned for each pixel, but formed as a common layer. One organic layer 131 and one organic layer 132 are laminated in the present embodiment. However, a plurality of organic layers 131 and a plurality of organic layers 132 may be laminated for the each of the organic layers of a plurality of emission colors, and may be configured to emit, for example, white light. The white light is separated to red color, green color, and blue color by transmitting the color filter layer and emitted.

Hereinbelow, the structure of each part will be described in detail. The planarized first insulating layer 102 includes a fine connection hole inside thereof. Thus, the first insulating layer 102 is preferably formed of a material having an excellent processing accuracy. The plug 103 which is made of a conductive metal is embedded in the connection hole. A transistor included in a pixel circuit which is disposed in the drive circuit layer 101 is electrically connected to the first electrode 110 through the plug 103. For example, an organic material such as acrylic or polyimide or an inorganic material such as silicon oxide (SiOx), silicon nitride (SiNx), or silicon oxynitride (SION) can be used as the material of the first insulating layer 102.

The first electrode 110 is electrically separated for each pixel, and also has a function as a reflective layer. The light emission efficiency of the organic light emitting element can be increased by increasing the reflectivity of the first electrode 110.

The thickness of the first electrode 110 is, for example, 30 nm to 1000 nm inclusive. The first electrode 110 has a structure in which a barrier metal layer 111, a reflective metal layer 112, and an injection efficiency adjusting layer 113 for adjusting a hole injection efficiency are laminated in this order from the first insulating layer 102 which serves as a base.

The barrier metal layer 111 may be a single layer or a laminated layer. For example, a titanium film (Ti film) having a thickness of 10 nm to 100 nm and a titanium nitride film having a thickness of 10 nm to 100 nm may be laminated from the first insulating layer 102. The reflective metal layer 112 preferably has a reflectivity of 70% or more in a visible light region. For example, the reflective metal layer 112 may be preferably formed of aluminum (Al), silver (Ag), or an alloy containing aluminum or silver. The film thickness of the reflective metal layer 112 is desirably 50 nm or more to obtain a high reflectivity.

On the other hand, the upper limit of the film thickness of the first electrode 110 is preferably determined taking into consideration reducing roughness on the surface or disconnection or high resistance which may occur in a region where the organic layer 130 and the second electrode 140 which are formed on the first electrode 110 extend across a step part of the first electrode 110. Thus, for example, the film thickness of the first electrode 110 is preferably smaller than the film thickness of the organic layer 130 which is disposed between the first electrode 110 and the second electrode 140.

When aluminum or an aluminum alloy is used as the reflective metal layer 112, the injection efficiency adjusting layer 113 is preferably formed on the reflective metal layer 112 taking into consideration reduction in the hole injection efficiency caused by surface oxidation or a low work function. A refractory metal such as titanium (Ti), tungsten (W), molybdenum (Mo), chromium (Cr), or tantalum (Ta) or an alloy material thereof, or a transparent electrode material such as ITO or IZO can be appropriately selected and used as the injection efficiency adjusting layer 113.

When a refractory metal such as Ti is used as the injection efficiency adjusting layer 113, the thickness of the injection efficiency adjusting layer 113 is preferably 50 nm or less taking into consideration reduction in the reflectivity of the first electrode 110.

The organic layer 130 is disposed over the first electrode 110 and the second insulating layer 120 commonly to the plurality of organic light emitting elements. The organic layer 130 has, for example, a structure in which the organic layer 131 which includes the hole injection layer and the hole transport layer and the organic layer 132 which includes the light emitting layer and an electron transport layer are laminated in this order from the first electrode. The organic layer 130 may not include either the hole injection layer or the hole transport layer or may further include an electron injection layer. Known organic materials can be used in an appropriately combined manner as the organic layer 130.

A material having a low resistance value is preferably selected as the hole injection layer in view of hole injection properties. Thus, the conductivity of the organic layer 131 is higher than the conductivity of the organic layer 132. Since the conductivity of the organic layer 131 is relatively high, light may be emitted between pixels or in an adjacent non-light emitting pixel due to leakage current through the organic layer 131. Thus, the leakage current can be reduced by reducing the film thickness of the organic layer 131 between pixels or making the organic layer 131 discontinuous between pixels.

The second electrode 140 is disposed over the first electrode 110 and the second insulating layer 120 with the organic layer 130 interposed therebetween. The second electrode 140 is common to the plurality of organic light emitting elements. The second electrode 140 is a conductive film having a light transmissive property, and may include a single layer of ITO, IZO, ZnO, Ag, or an MgAg alloy, or a laminated film containing two or more kinds of these materials. A material layer constituting the second electrode 140 may be a plurality of layers made of, for example, lithium fluoride and calcium taking electron injection properties into consideration. The second electrode 140 is electrically connected to the wiring layer included in the drive circuit layer 101 around the pixel region (not illustrated).

When the film thickness of the second electrode 140 is reduced to increase the transmittance of the second electrode 140, the second electrode 140 may also be electrically connected to the wiring layer included in the drive circuit layer 101 within the pixel region taking into consideration a relatively high sheet resistance of the second electrode 140.

The moisture-proof layer 150 is disposed over the second electrode 140 commonly to the plurality of organic light emitting elements. The moisture-proof layer 150 is, for example, a silicon nitride (SiNx) film having a thickness of 0.1 µm to 10 µm.

The color filter layer 170 is disposed over the moisture-proof layer 150. The color filter layer 170 extracts light generated in each of the organic light emitting elements as red light, green light, and blue light for each sub-pixel. A light shielding unit for reducing color mixture between pixels may be disposed between color filter patterns which are arranged for the respective emission colors.

As illustrated in FIG. 4, the second insulating layer 120 covers the upper face and the side face of an end of each first electrode 110. The second insulating layer 120 is deposited across the first electrode 110 and the first insulating layer 102 so that the second insulating layer 120 covers an interface between the first electrode 110 and the first insulating layer 102. In the present embodiment, between adjacent first electrodes 110, the bottom of the recess 200 which is formed on the upper face of the second insulating layer 120 has a part shallower than the bottoms of the first electrodes 110.

As described above, in order to increase the resistance of the organic layer 131 to reduce leakage current, the aspect ratio of the recess 200 is preferably 0.5 or more, and more preferably 1.0 or more. The aspect ratio of the recess 200 indicates the ratio of the length D1 of the recess 200 in the direction Z in which the first electrode 110 is laminated on the first insulating layer 102 to the length S1 of the recess 200 in the direction Y perpendicular to the lamination direction Z (D1/S1). For example, a groove may be formed on the first insulating layer 102 which serves as the base of the second insulating layer 120 between adjacent first electrodes 110 to make the height of the surface of the first insulating layer 102 lower than the bottoms of the first electrodes 110. That is, the first insulating layer 102 may include a recess. For example, the depth (D2 in the drawing) of the groove of the first insulating layer 102 may be in the range of 1 nm to 100 nm. Accordingly, the aspect ratio of the recess 200 (described below) can be easily increased. Further, the first insulating layer 102 may include a plurality of recesses.

In FIG. 4, the width of a space between the first electrodes 110 that are disposed adjacent to each other is denoted by S0, and the width of a space between parts of the second insulating layer 120, the parts covering the side faces of the first electrodes 110, is denoted by S1.

In the present embodiment, the aspect ratio of the recess 200 on the upper face of the second insulating layer 120 between the first electrodes 110 is 0.5 or more.

Thus, for example, the width (S1) of the space between the parts of the second insulating layer 120, the parts covering the side faces of the first electrodes 110 that are disposed adjacent to each other, is made sufficiently narrow relative to the width (S0) of the space between the adjacent first electrodes 110. That is, it is desired that the relationship (aspect ratio) between the depth (D1) of the recess 200 on the upper face of the second insulating layer 120 and the width (S1) of the space thereof satisfy the relationship of the following <Formula 1>. Here, the width S1 of the space between the above parts of the second insulating layer 120 indicates the distance between parts of the second insulating layer 120 where the upper face of the second insulating layer 120 starts inclining so as to form the recess 200.

$$D1/S1 \geq 0.5 \qquad \text{<Formula 1>}$$

More preferably, it is desired to satisfy the relationship of $D1/S1 \geq 1$.

For example, in the high-definition display device as described in the present embodiment, when the width S0 is 100 nm to 500 nm, the width S1 is set in the range of 10 nm to 500 nm. When the width S1 and a width S3 satisfy S1>S3, the width S1 may be larger than the width S0.

The width S1 of the space in the second insulating layer 120 is preferably larger than the film thickness of the organic layer 131 (the organic layer having a lower resistance than the organic layer 132) which is provided as a common layer. The space in the second insulating layer 120 is formed so as to at least leave a clearance indicated by the width S3 in the drawing in the organic layer 131 (e.g., the hole injection layer) having a low resistance.

Setting the lower limit of the width S1 of the space in the second insulating layer 120 in this manner makes it easy to locally increase the resistance of the organic layer 131 having a low resistance between the adjacent first electrodes 110 using the inside of the recess 200 on the upper face of the second insulating layer 120. In order to locally increase the resistance of the organic layer 131 with high efficiency, the width between the inner walls of the recess 200 is preferably smaller than the width S1.

The width S1 of the space in the second insulating layer 120 is preferably smaller than the total thickness of the organic layer 130 which is sandwiched between the first electrode 110 and the second electrode 140. Setting the upper limit of the width S1 of the space in the second insulating layer 120 makes it possible to make the depth (D3 in the drawing) of a recess of the organic layer laminated on the recess 200 on the upper face of the second insulating layer 120 shallower than the depth D1 of the recess 200 of the second insulating layer 120.

Thus, it is possible to prevent the second electrode 140 from locally having a high resistance and having disconnection above the recess 200 having a high aspect ratio on the upper face of the second insulating layer 120. For example, setting the aspect ratio of the recess 200 to 1 or more makes it possible to prevent the second electrode 140 from locally having a high resistance and having disconnection above the recess 200 of the second insulating layer 120. Accordingly, it is possible to prevent deterioration of the display performance such as shading (unevenness in luminance caused by a voltage drop within the surface of the second electrode 140).

In the form as illustrated in FIG. 3 in which the moisture-proof layer 150 is laminated over the second electrode 140, roughness of the surface of the second electrode 140 which serves as the base of the moisture-proof layer 150 is reduced as described above. Accordingly, it is possible to reduce the size or the probability of occurrence of a defect of the moisture-proof layer 150 caused by the roughness. The defect of the moisture-proof layer 150 described herein is, for example, a low-density part included near the step or an interface (hollow) formed between moisture-proof layers.

A structure that includes the moisture-proof layer 150 having a smaller film thickness than a conventional one can be selected by reducing the defect of the moisture-proof layer 150 in this manner Thus, it is possible to reduce the distance from a light emission position to the color filter layer 170. Thus, for example, it is possible to reduce color mixture in the display device and improve a viewing angle characteristic (reduce a relative chromaticity change with respect to a wider viewing angle).

Further, it is also possible to improve the accuracy of patterning the color filter layer 170 which is disposed over the moisture-proof layer 150 by reducing the roughness of the surface of the moisture-proof layer 150 in this manner Thus, higher-definition display can be achieved.

Figure 5A:
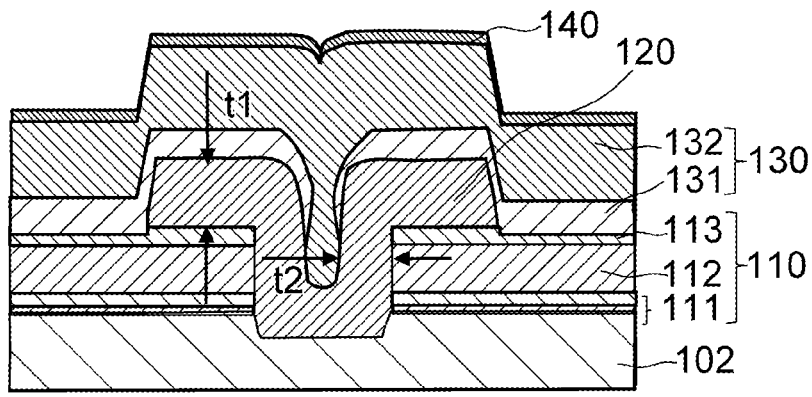
FIGS. 5A to 5C are sectional views of the pixel portion of an example of the display device according to the first embodiment.
Figure 5B:
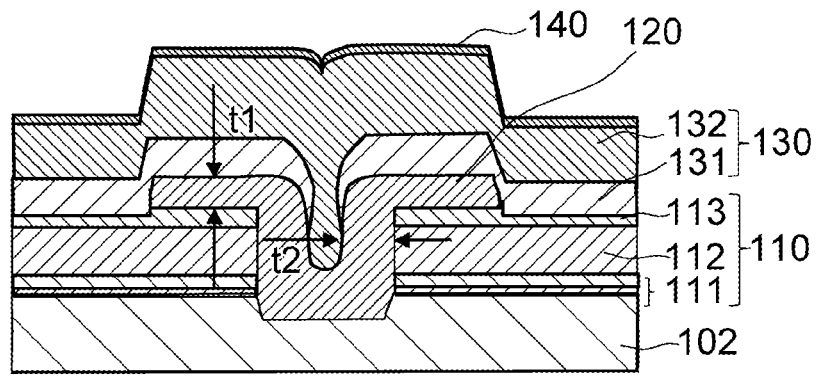
Figure 5C:
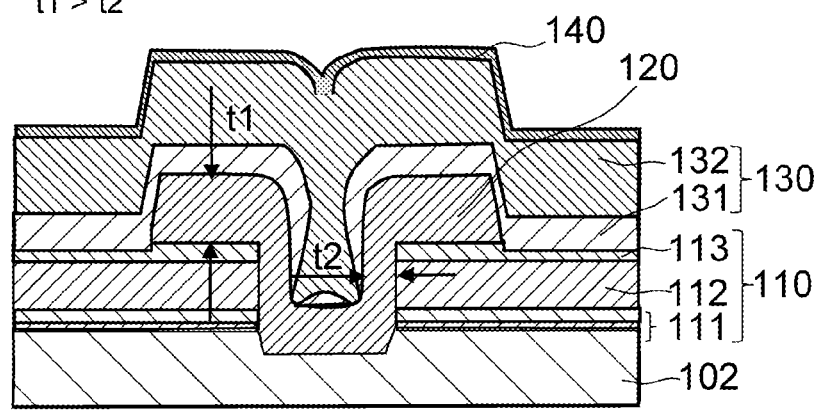

FIGS. 5A to 5C illustrate examples of a sectional structure diagram of the second insulating layer 120 which covers the first electrodes 110. For example, as illustrated in FIG. 5A, when the film thickness of the second insulating layer 120 on the end of the first electrode 110 is denoted by t1, and the film thickness of the second insulating layer 120 on the side face of the first electrode 110 is denoted by t2, these film thicknesses may be equal to each other (t1=t2).

Alternatively, as illustrated in FIG. 5B, the film thickness t2 of the second insulating layer 120 on the side face of the first electrode 110 may be larger than the film thickness t1 of the second insulating layer 120 on the end of the first electrode 110 (t1<t2). Accordingly, for example, even when there is a limitation on the upper limit of the film thickness t1 on the end, a predetermined recess can be formed. Further, a recess having a narrower frontage than that in FIG. 5A can be formed.

Further, as illustrated in FIG. 5C, the film thickness t2 of the second insulating layer 120 on the side face of the first electrode 110 may be smaller than the film thickness t1 of the second insulating layer 120 on the end of the first electrode 110 (t1>t2). Accordingly, for example, it becomes easy to leave a clearance in the organic layer 131 on the opposed side faces of the recess 200 of the second insulating layer 120.

In all of FIGS. 5A to 5C, the recess 200 on the upper face of the second insulating layer 120 between the adjacent first electrodes 110 has a high aspect ratio, and the width (frontage) of the upper part of the recess 200 can be reduced.

Figure 6A:
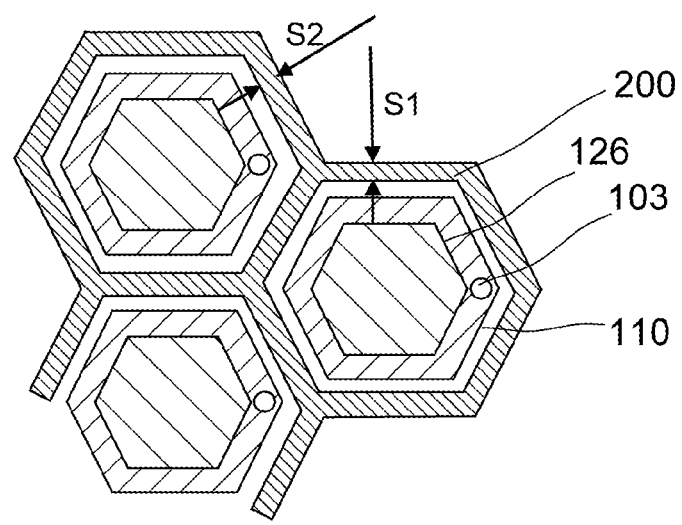
FIGS. 6A and 6B are plan views of the pixel region of an example of the display device according to the first embodiment.
Figure 6B:
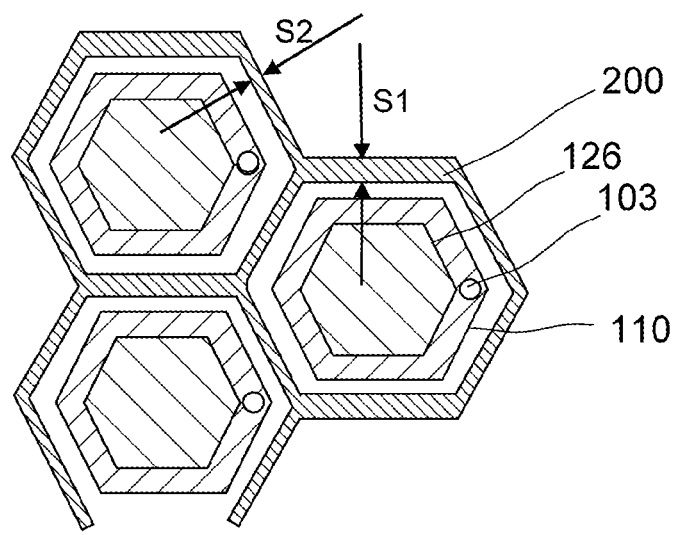

FIGS. 6A and 6B illustrate examples of a planar structure diagram of the recess 200 on the upper face of the second insulating layer 120 between adjacent first electrodes 110 in the display device according to the present embodiment.

In the present embodiment, the width and the depth of the recess 200 depends on the shape of the base of the second insulating layer 120.

For example, as illustrated in FIG. 6A, recesses 200 having a common width (S1, S2) may be formed between all of the first electrodes 110 (S1=S2 in FIG. 6A). Alternatively, as illustrated in FIG. 6B, recesses 200 having different widths may be arranged in a combined manner within the display region (S1<S2 in FIG. 6B). In this case, for example, the first electrodes 110 may have different widths corresponding to the widths of the respective recesses 200 of the second insulating layer 120. The recesses 200 may have different aspect ratios corresponding to the widths of the recesses 200, and the relationship of Formula (1) may be satisfied in at least some of the recesses 200. When all of the recesses 200 are configured to satisfy the relationship in aspect ratio of Formula (1), it is possible to more preferably reduce leakage current caused by the organic layer 131.

Further, recesses 200 having different depths may be arranged in a combined manner. In this case, for example, the distance from the upper face of the first electrode 110 to the upper face of the first insulating layer 102 may be varied corresponding to the depth of the recess between the first electrodes 110. Specifically, as the distance from the upper face of the first electrode 110 to the upper face of the first insulating layer 102 increases, the depth of the recess 200 which covers the upper face and the side face of the end of the first electrode 110 increases.

The aspect ratio of the recess 200 may vary according to the depth of the recess 200. However, the relationship of Formula (1) may be satisfied in at least some of the recesses 200.

The widths and the depths of the recesses 200 as described above may be combined in any manner. For example, as described above, the recesses 200 having nonuniform widths and depths may be appropriately selected and disposed taking into consideration the shape and the array of pixels in the display region and the resistance distribution of the second electrode 140. Further, in order to prevent deterioration of the display characteristic (reduction in a color reproduction range caused by color mixture) caused by leakage current between pixels having different emission colors, the recess 200 having a relatively high aspect ratio may be formed between pixels having different emission colors.

The thickness of the second insulating layer 120 may be, for example, 1 nm to 500 nm. For example, an organic material such as acrylic or polyimide or an inorganic material such as silicon oxide (SiOx), silicon nitride (SiNx), or silicon oxynitride (SION) can be used as the material of the second insulating layer 120. Since the organic layer deteriorates by the influence of moisture, the material of the second insulating layer 120 is preferably selected from materials having a low moisture content. The second insulating layer 120 having such a structure is capable of ensuring an insulating property between the first electrode 110 and the second electrode 140 by preventing exposure of the end of the first electrode 110.

The second insulating layer 120 defines a light emission region on the first electrode 110. The second insulating layer 120 extends between the first electrodes 110 that are arrayed adjacent to each other, covers the ends (peripheral edges) of the first electrodes 110, and has an opening in a part corresponding to the light emission region on each of the first electrodes 110.

In order to prevent the malfunction of a local high resistance of the second electrode 140, part of the roughness on the surface of the second insulating layer 120 may have an easy slope. For example, the side face of an opening 126 of the second insulating layer 120 over the first electrode 110 may have an easy slope or a step-like shape. Alternatively, the side face may have a plurality of angles.

The angle of the inclination or the step height or the width of the multistep structure of the side face of the opening 126 may be set in any manner within a range that constitutes no obstacle to the display performance taking into consideration, for example, the step coverage property and the resistance distribution of the second electrode 140.

Figure 21:
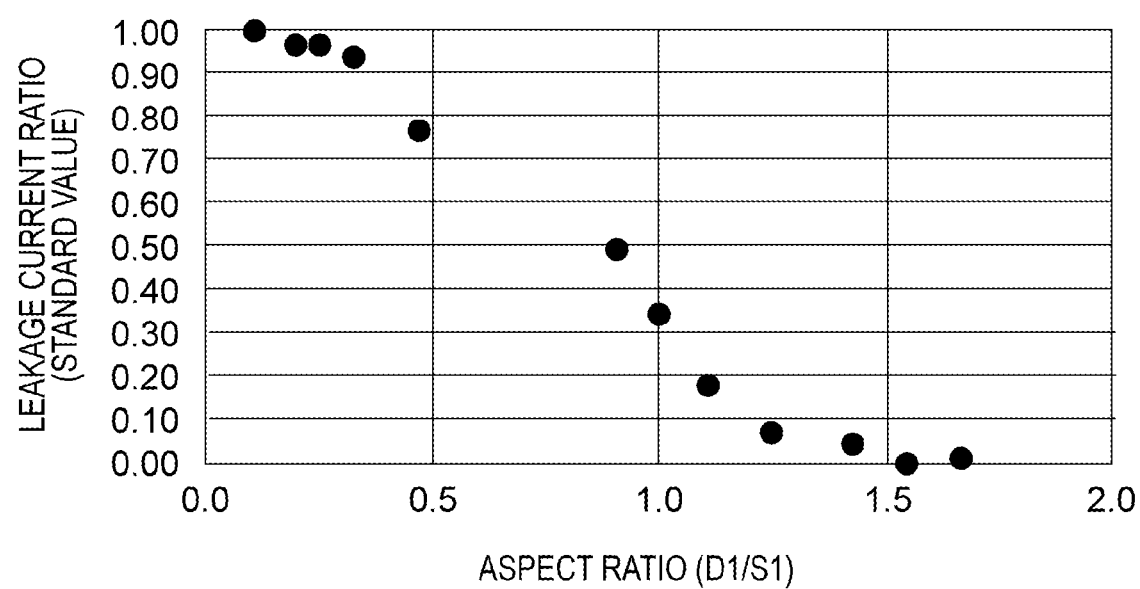
FIG. 21 is a leakage characteristic graph of an example of the display device according to the first embodiment.

FIG. 21 is a graph of a leakage current ratio (current flowing in an inter-pixel direction/current flowing in an organic layer film thickness direction) which depends on the aspect ratio of the recess 200 of the second insulating layer 120. The vertical axis represents the leakage current ratio (current flowing in the inter-pixel direction/current flowing in the organic layer film thickness direction), and the horizontal axis represents the aspect ratio of the recess 200. When the aspect ratio of the recess 200 is 0.5 or more, a decreasing rate of the leakage current ratio increases. When the aspect ratio is 1.0 or more, the leakage current ratio becomes half or less, which shows that the leakage current can be more effectively reduced.

The result shown in the graph is an example. The leakage current ratio changes depending on the distance between the first electrodes 110, the film thickness of the organic layer 131, the resistivity of the organic layer 131, the material of the organic layer 131, and a combination thereof. Also in this case, the leakage current between pixels can be sufficiently reduced by setting the aspect ratio to 0.5 or more, and more preferably, to 1.0 or more.

Next, an example of a method for manufacturing the display device of the present embodiment will be described with reference to FIGS. 7A to 7C, 8A and 8B, 9A and 9B, and 10A and 10B.

Figure 7A:
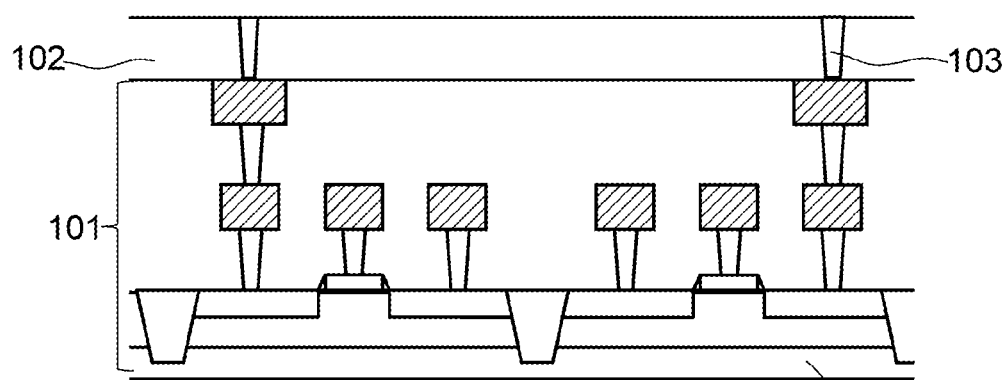
FIGS. 7A to 7C are manufacturing process flow diagrams of an example of the display device according to the first embodiment.

First, as illustrated in FIG. 7A, the transistor and the capacitor of the drive circuit which includes the pixel drive circuit are formed on the substrate described above by a known MOS process.

Next, an insulating film such as an oxide silicon film (SiOx) or an oxynitride silicon film (SiON) is formed to form the first insulating layer 102 by a plasma CVD method, a high-density plasma method, or a combination of these methods. After the first insulating layer 102 is formed, the surface of the first insulating layer 102 including the pixel region may be planarized by a CMP method.

Next, in the first insulating layer 102, a plurality of openings are formed at predetermined positions by a photolithography method and a dry etching method. For example, tungsten (W) is disposed in each of the openings, and an excessive part is removed by a CMP method or an etch back method. Accordingly, the plugs 103 made of a conductive material (tungsten) are formed.

Figure 7B:
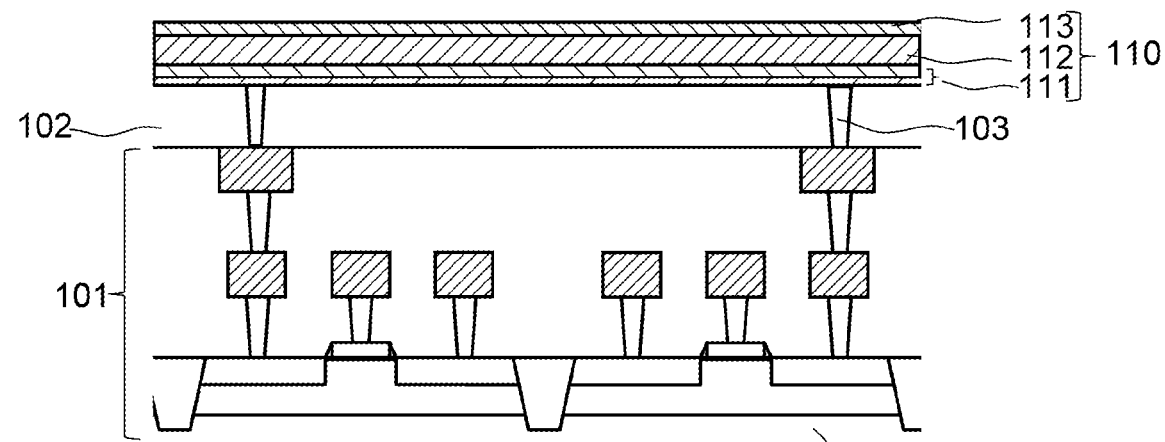

Next, as illustrated in FIG. 7B, a laminated metal film which includes titanium (Ti), titanium nitride (TiN), an aluminum alloy, and titanium (Ti) is formed on the first insulating layer 102 by, for example, a sputtering method.

Figure 7C:
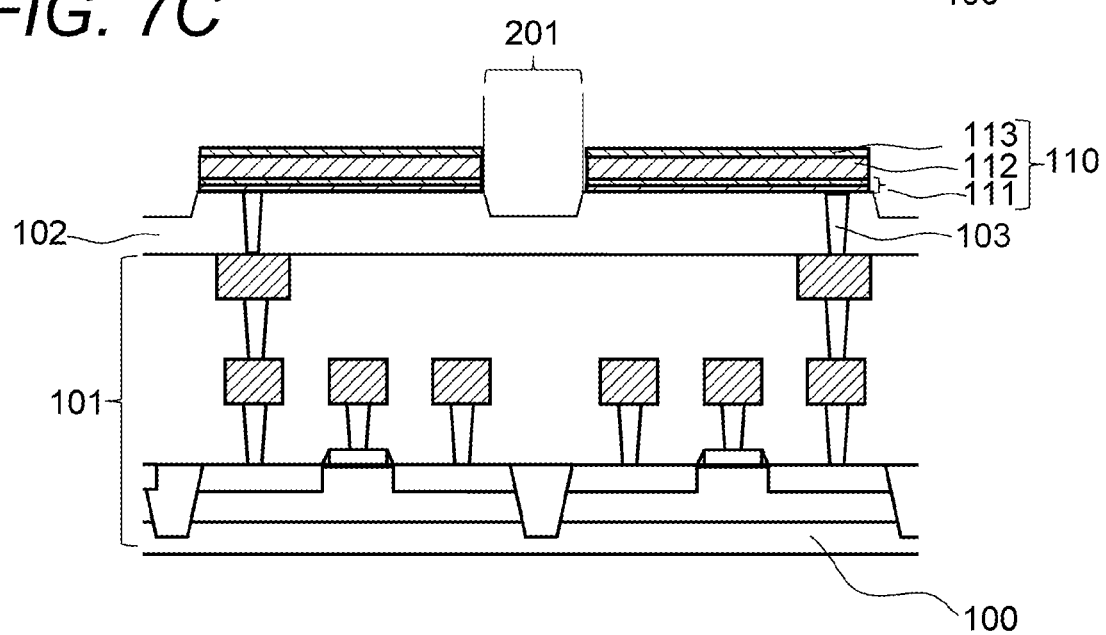

As illustrated in FIG. 7C, the laminated metal film is patterned into a predetermined shape by a photolithography method and a dry etching method or a wet etching method to form a plurality of first electrodes 110 which are connected to the plugs 103 in the display region.

The surface of the first insulating layer 102 between the first electrodes 110 is preferably etched in such a manner that the surface is located at a position deeper than the bottoms of the first electrodes 110 (deeper as closer to the substrate from the surface of the first insulating layer 102). Although the first electrodes 110 and the first insulating layer 102 may be separately etched, the first electrodes 110 and the first insulating layer 102 are preferably collectively etched. Accordingly, it is possible to accurately align the side face position of the first electrode 110 with the position of the inner wall of the recess 201 of the first insulating layer 102.

Accordingly, a desired recess 201 can be formed on the first insulating layer 102 also between the first electrodes 110 which are arrayed with high density. For example, the depth of the recess 201 on the first insulating layer 102 can be selected in any manner from the range of 1 nm to 100 nm. The depth of the recess 200 on the upper face of the second insulating layer 120, which is formed in the next process, can be increased by increasing the depth of the recess 201. Thus, it is possible to easily increase the aspect ratio of the recess 200.

Figure 8A:
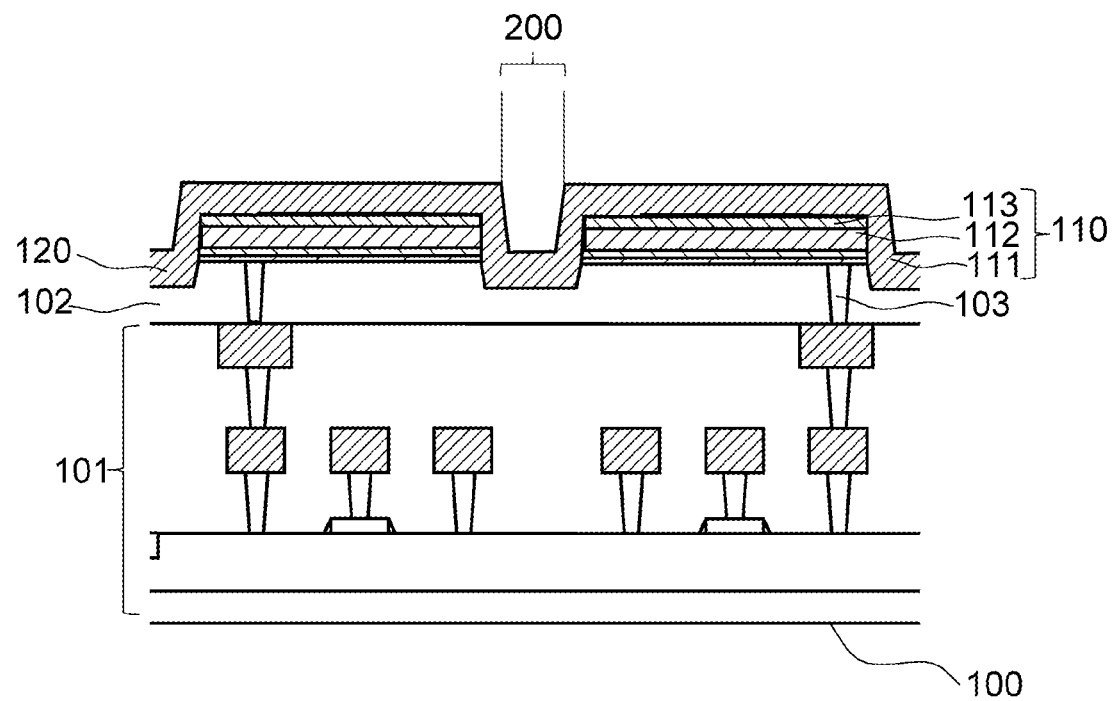
FIGS. 8A and 8B are manufacturing process flow diagrams of an example of the display device according to the first embodiment.

Next, as illustrated in FIG. 8A, an insulating layer such as an oxide silicon film (SiOx), an oxynitride silicon film (SiON), or a silicon nitride film (SiNx) is formed over the first electrodes 110 by a plasma CVD method to form the second insulating layer 120. A film forming temperature of the second insulating layer 120 which is directly deposited on the first electrodes 110 each of which includes an aluminum alloy film as the reflective metal layer 112 is preferably 400° C. or less in order to prevent variations in the surface roughness of the aluminum alloy. In this manner, between the first electrodes 110, the recess 200 which extends along the surface as the base is formed on the upper face of the second insulating layer 120 which covers the side faces of the first electrodes 110 and an exposed surface of the first insulating layer 102 which includes the recess 201.

The distance from the side face of each of the first electrodes 110 which sandwich the recess 200 on the upper face of the second insulating layer 120 to the inner wall of the recess 200 corresponds to the film thickness of the second insulating layer 120 on the side face of the first electrode 110. Thus, the distance can be made substantially uniform between each of the two first electrodes 110 and the corresponding inner wall of the recess 200. That is, the recess 200 can be formed between the first electrodes 110 by self-alignment (with high position accuracy). Thus, it is possible to substantially uniformly reduce leakage current between pixels within the display region surface.

The film thickness of the second insulating layer 120 may be, for example, 1 nm to 500 nm. For example, the film thickness of the second insulating layer 120 can be selected so that the recess 200 which is formed along the surface thereof has a desired width or a desired depth. With such a structure and method, the recess 201 can be formed on the surface (upper face) on which the organic layer 131 is deposited by depositing an insulating material to be the second insulating layer 120 along the recess 200 which is formed between the adjacent first electrodes 110.

That is, it is possible to form the recess 200 of the present embodiment which has a smaller width than the recess between the first electrodes 110 which is formed by etching the first insulating layer 102 and the first electrodes 110. This is advantageous in locally thinning the organic layer 131 inside the recess 200 in a film forming process for the organic layer 131 described below. Further, this is advantageous also in reducing asperities on the upper face of the organic layer 130 to prevent a local increase in the resistance and improve the flatness on the upper surface in the second electrode 140 which is formed over the organic layer 130.

A maximum step on the surface of the second insulating layer 120 on the substrate is preferably the recess between the first electrodes 110 described above. That is, when the bottom of the recess 200 is shallower than the bottom of the first electrode 110, the distance between the bottom face of the recess 200 of the second insulating layer 120 and the upper face of the second insulating layer 120 is preferably the maximum step. The "bottom of the recess 200 is shallower than the bottom of the first electrode 110" means that the bottom face of the recess 200 is located closer to the second electrode 140 from the substrate than the bottom face of the first electrode 110 is. In this case, the recess 200 of the second insulating layer 120 is preferably formed on a face that is located at the same height as the uppermost face of the second insulating layer 120.

Accordingly, the second electrode 140 and the moisture-proof layer 150 which are formed in the next or subsequent processes may be formed so as to have a coverage property with respect to a minimum step required to reduce leakage between pixels. Thus, it is possible to easily secure a coverage margin of the second electrode 140 and the moisture-proof layer 150. For example, since a defect of the second electrode 140 and the moisture-proof layer 150 can be reduced, it is possible to prevent deterioration of the display performance.

The film forming method for the second insulating layer 120 is not limited to the above method. A known method that forms an insulating layer can be applied in any manner. For example, as a manufacturing method other than the above method, a high-density plasma CVD method, an ALD method, a sputtering method, or a manufacturing method by applying a coating material by a spin coat method or a slit coat method may be selected. The second insulating layer 120 may be formed by laminating a plurality of layers. As the plurality of layers, the same materials may be laminated, or different kinds of materials may be laminated in a combined manner.

Figure 8B:
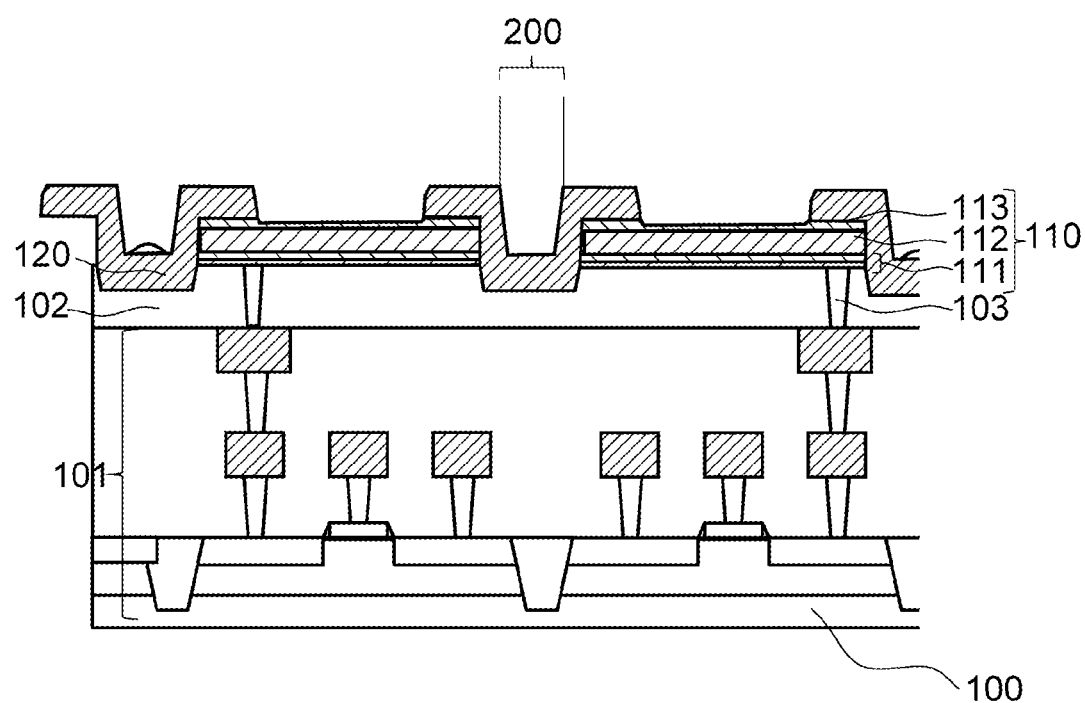

Next, as illustrated in FIG. 8B, the insulating layer to be the second insulating layer 120 is patterned into a predetermined shape by a photolithography method and a dry etching method to form corresponding openings over the first electrodes 110. At the same time, an opening for connecting the second electrode 140, which is formed in the later process, to the metal layer which is the same layer as the first electrode 110 is also formed (not illustrated).

Next, cleaning is performed to remove a foreign substance on the substrate (on the first electrodes 110 and the second insulating layer 120) before formation of the organic layer in the next process. After such a cleaning process, dehydration is performed to remove moisture on the surface of the substrate.

Figure 9A:
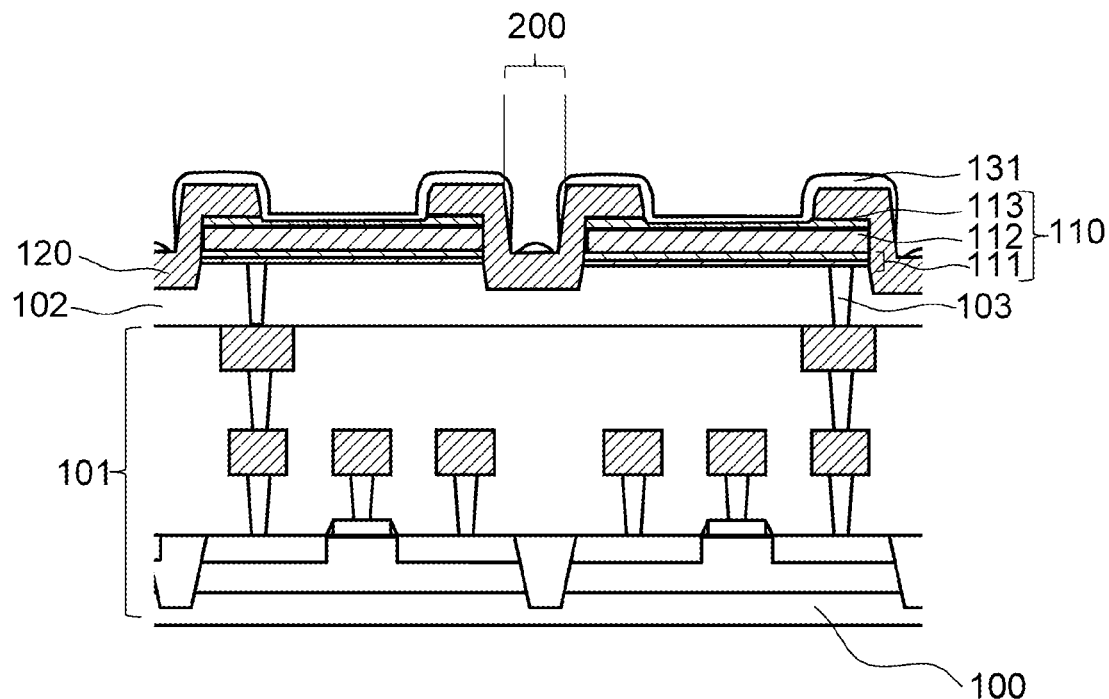
FIGS. 9A and 9B are manufacturing process flow diagrams of an example of the display device according to the first embodiment.

Then, as illustrated in FIG. 9A, organic layers having a relatively low resistance such as a hole injection layer and a hole transport layer are sequentially deposited as organic materials which constitute the organic light emitting elements by, for example, a vacuum evaporation method to form the organic layer 131. For example, a rotary evaporation method, a linear evaporation method, or a transfer evaporation method can be used as the vacuum evaporation method.

Figure 11:
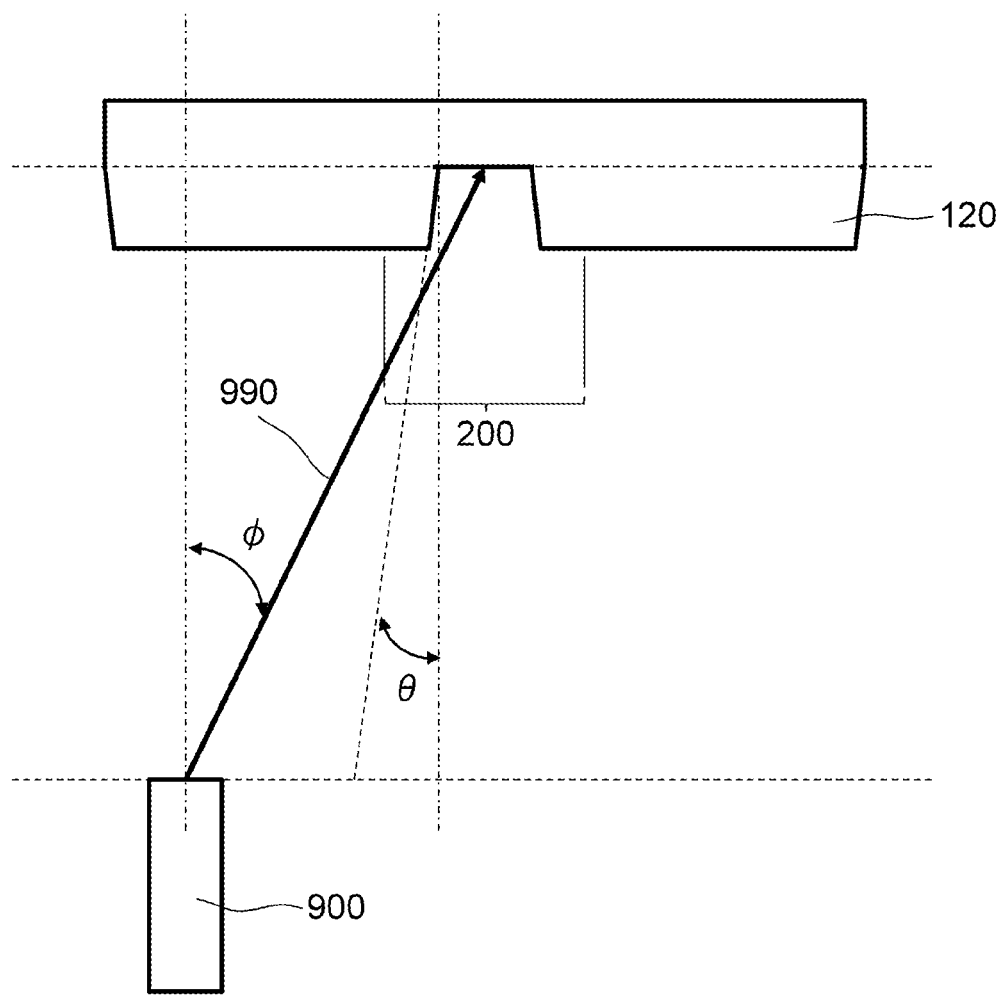
FIG. 11 is a schematic diagram of an evaporation process of an example of the display device according to the first embodiment.

FIG. 11 is a schematic diagram describing evaporation. For example, a maximum value of an incidence angle $\phi$ of the organic material which is incident on the recess 200 of the second insulating layer 120 from a evaporation source 900 is made larger than an inclination angle $\theta$ of the inner wall of the recess 200 in a part where the inclination angle $\theta$ is maximum in an evaporation period of an organic layer having a low resistance. The organic layer having a low resistance includes, for example, a hole injection layer and a hole transport layer. As illustrated in FIG. 11, in the vacuum evaporation, a track 990 of an evaporated organic matter from the evaporation source 900 toward the recess 200 is substantially straight. Thus, shadowing occurs inside the recess 200 to form a film thickness distribution.

The organic layer 131 which is formed in this manner and includes the organic layer having a low resistance such as a hole injection layer or a hole transport layer has a part whose film thickness is reduced along the depth direction of the recess inside the recess 200 which is formed on the surface of the second insulating layer 120. That is, a part having a high resistance is locally formed on the organic layer 131 having a low resistance inside the recess 200. Leakage current through the low-resistance organic layer 131 can be reduced by forming such a high-resistance part.

Figure 9B:
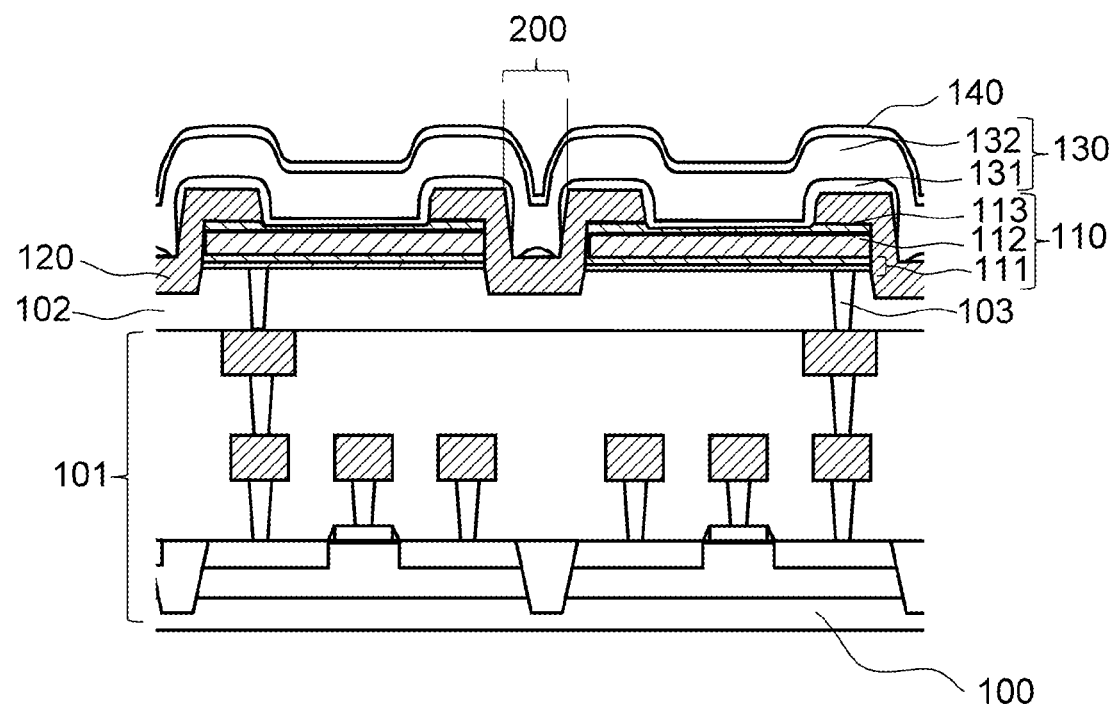

Then, as illustrated in FIG. 9B, organic layers such as a light emitting layer and an electron transport layer are sequentially deposited as organic materials which constitute organic light emitting elements by, for example, a vacuum evaporation method to form the organic layer 132. Then, the second electrode 140 is formed by a vacuum evaporation method without opening to the atmosphere from a reduced-pressure atmosphere. The organic layer 132 may include only a light emitting layer or may have a structure in which at least either an electron transport layer or an electron injection layer is laminated on a light emitting layer.

Although the present embodiment describes an example in which the second electrode 140 is formed over the organic layer 131 and the organic layer 132, the light emitting device of the present embodiment is not limited thereto. For example, an organic layer which includes at least either a hole injection layer or a hole transport layer and an organic layer which includes a light emitting layer which emits light having a color different from a color of light emitted by the light emitting layer of the organic layer 132 may be laminated on the organic layer 132. Further, an organic layer which includes at least either a hole injection layer or a hole transport layer and an organic layer which includes a light emitting layer which emits light having a color different from colors of light emitted by the above light emitting layers may be further laminated thereon. The organic layer including each of the light emitting layers may further include an electron transport layer or an electron injection layer.

For example, a rotary evaporation method, a linear evaporation method, or a transfer evaporation method can be used as the vacuum evaporation method described above. For example, the organic layer 132 which includes the light emitting layer and the electron transport layer is common between pixels. Thus, it is not necessary to locally reduce the film thickness of the organic layer 132 inside the recess 200. Thus, the organic layer 132 may have a film thickness distribution that differs from the film thickness distribution of the organic layer having a low resistance such as a hole injection layer or a hole transport layer and preferably has a film thickness distribution that reduces the influence of the recess 200.

In the above vacuum evaporation method, each material layer can be selectively deposited in a predetermined region by using a metal mask.

Figure 10A:
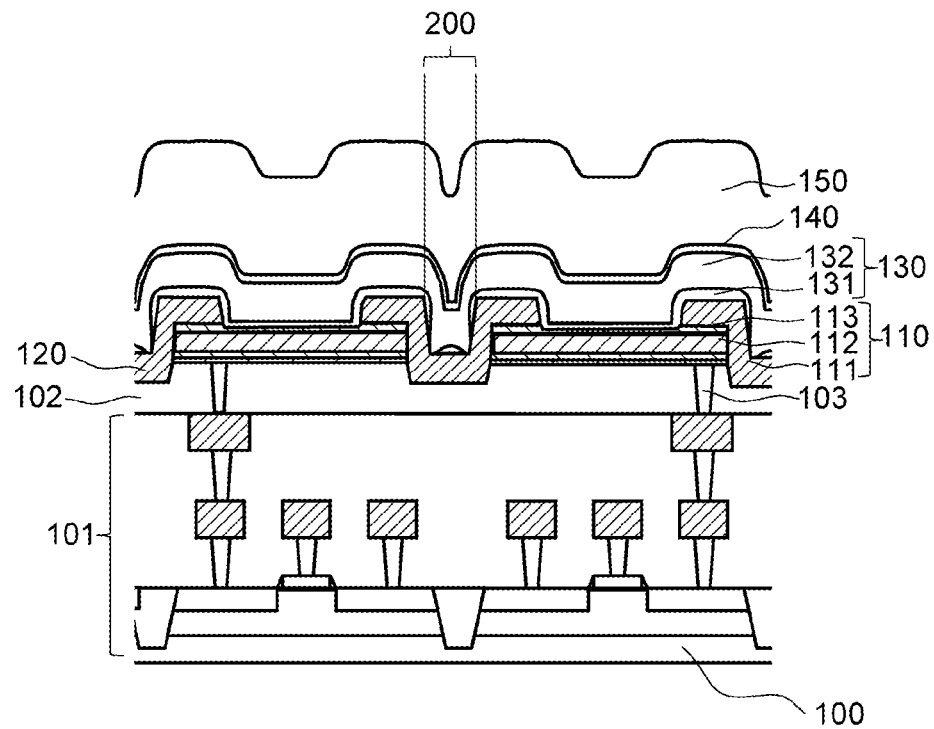
FIGS. 10A and 10B are manufacturing process flow diagrams of an example of the display device according to the first embodiment.

Next, as illustrated in FIG. 10A, the moisture-proof layer 150 is formed so as to cover the second electrode 140 by, for example, a plasma CVD method, a sputtering method, an ALD method, or a combination thereof. A film forming temperature of the moisture-proof layer 150 is preferably equal to or less than a decomposition temperature of the organic materials of the organic layer 131 and the organic layer 132, for example, 120° C. or less.

Figure 10B:
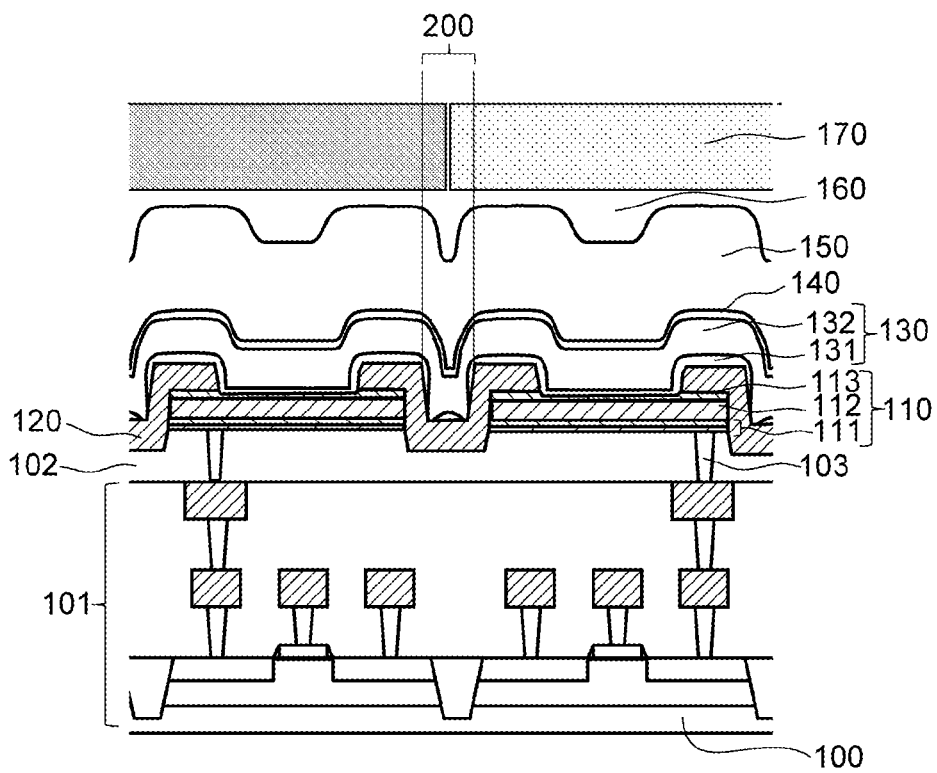

Next, as illustrated in FIG. 10B, for example, a material of a red filter is applied onto the moisture-proof layer 150 and patterned by photolithography to form a red filter part. Then, in a manner similar to the red filter, a green filter and a blue filter are sequentially formed to form the color filter layer 170.

A processing temperature in the process of forming the color filter layer 170 is preferably equal to or less than the decomposition temperature of the organic materials of the organic layer 131 and the organic layer 132, for example, 120° C. or less. The planarized layer 160 which is transparent and has flatness for improving adhesion between the color filter layer 170 and the moisture-proof layer 150 may be formed between the color filter layer 170 and the moisture-proof layer 150.

Next, a terminal extraction pad in the display device is patterned into a predetermined shape by a photolithography method and a dry etching method.

The display device according to the present embodiment described above includes the second insulating layer 120 which is continuous between the opposed ends of the adjacent first electrodes 110 from an upper part of one of the ends to an upper part of the other end. That is, the upper face of the first insulating layer 102 is covered with the second insulating layer 120 and not in contact with the organic layer 131 between the first electrodes 110. Thus, it is possible to reduce or prevent leakage current flowing to the organic layer 131 through the interface between the first insulating layer 102 and the second insulating layer 120.

Further, the aspect ratio of the recess 200 on the upper face of the second insulating layer 120 between the organic light emitting elements is 0.5 or more. Accordingly, the film thickness of the low-resistance organic layer 131 can be reduced inside the recess 200. Thus, it is possible to reduce leakage current through the organic layer 131 on the second insulating layer 120 between adjacent pixels.

When the aspect ratio of the recess 200 is 1 or more, it is possible to prevent high resistance or discontinuity of the second electrode 140 caused by a locally small film thickness of the second electrode 140 above the recess 200.

Second Example Embodiment

In the present embodiment, only a part that differs from the first embodiment will be described with reference to FIGS. 12 and 13. Description for a configuration, a function, a material, and an effect that are similar to those of the first embodiment will be omitted.

Figure 12:
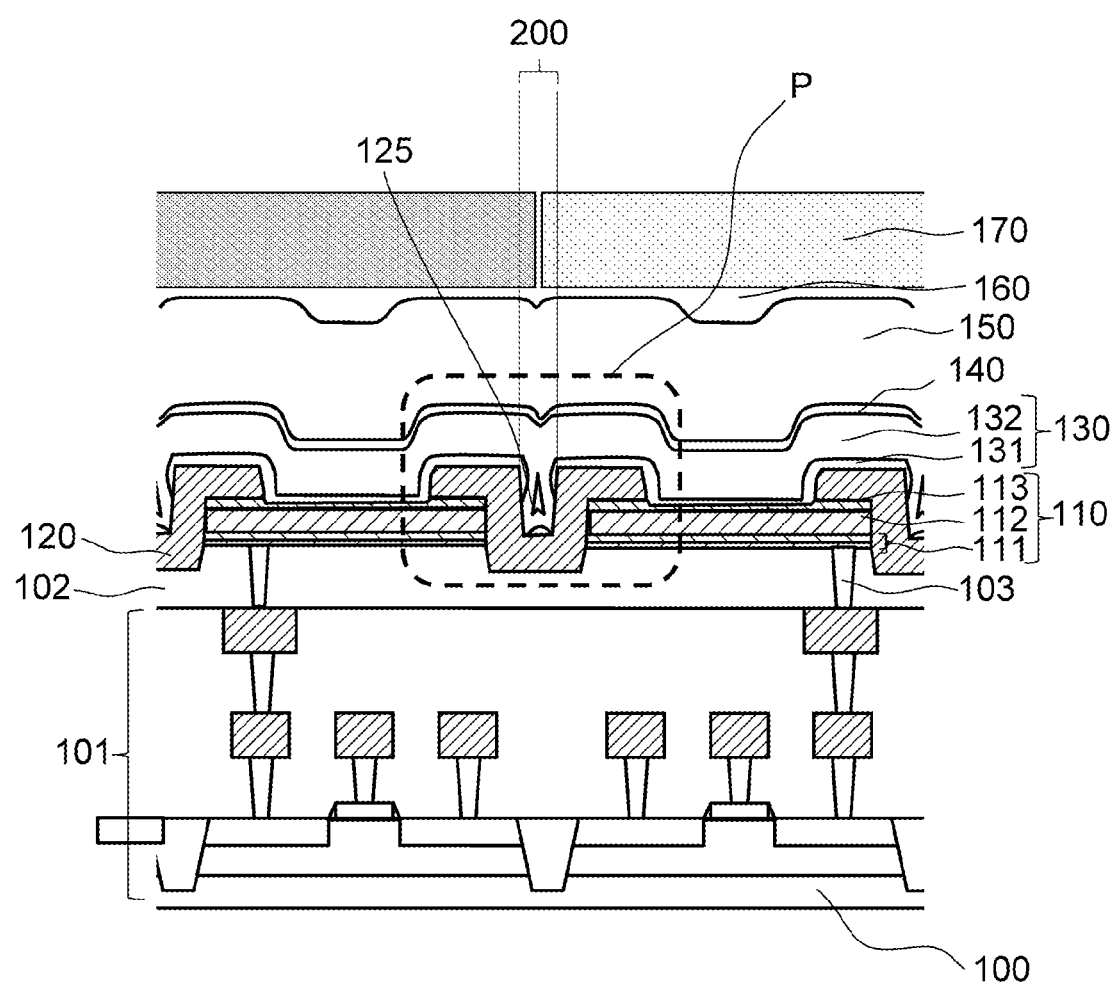
FIG. 12 is a sectional view of an organic light emitting element of an example of a display device according to a second embodiment.

FIG. 12 is a schematic sectional view of a part corresponding to line A-A' which extends across two adjacent sub-pixels in FIG. 2 described in the first embodiment. As described above, there are a pixel region and a peripheral circuit region on a substrate 100. A drive circuit layer 101 which includes a pixel circuit is disposed corresponding to each of the regions. The drive circuit layer 101 includes various transistors, a capacitor unit, and a wiring layer. The drive circuit layer may be appropriately provided with a light shielding layer for reducing stray light to the transistors.

A first insulating layer 102 is disposed over the drive circuit layer 101. Organic light emitting elements as light emitting elements EL are arrayed on the first insulating layer 102. These organic light emitting elements on the first insulating layer 102 may have a structure in which, for example, a first electrode 110 as an anode, a second insulating layer 120, an organic layer 131, an organic layer 132 which includes a light emitting layer, and a second electrode 140 as a cathode are laminated in this order.

Between adjacent first electrodes 110, the upper face of the second insulating layer 120 includes a recess 200, and a cavity 125 is present inside the recess 200. An organic layer 130 is disposed on the recess of the second insulating layer 120 with the cavity 125 interposed therebetween. The organic light emitting elements are protected by a moisture-proof layer 150 which is disposed over the second electrode 140. A planarized layer 160 and a color filter layer 170 may be disposed over the moisture-proof layer 150.

Hereinbelow, the structure of each part will be described in detail. FIG. 13 is an enlarged schematic sectional view of a region P surrounded by a broken line in FIG. 12. The region P is a region from one of opposed ends of the adjacent first electrodes 110 to the other end.

The second insulating layer 120 covers the upper face and the side face of the end of each of the first electrodes 110. Further, the second insulating layer 120 is disposed continuously between the opposed ends of the adjacent first electrodes 110 from an upper part of one of the ends to an upper part of the other end. The second insulating layer 120 covers an interface between the first electrode 110 and the first insulating layer 102. Thus, it is possible to reduce or prevent leakage current from flowing to the organic layer 131 through an interface between the first insulating layer 102 and the second insulating layer 120.

The present embodiment describes an example in which, between the adjacent first electrodes 110, the bottom of the recess 200 on the upper face of the second insulating layer 120 has a part shallower than the bottoms of the first electrodes 110. Further, there is described an example in which, between the adjacent first electrodes 110, the height of the surface of the first insulating layer 102 which serves as a base of the second insulating layer 120 is lower than the bottoms of the first electrodes 110 (has a groove). For example, the depth of the groove of the first insulating layer 102 (D2 in the drawing) can be selected in any manner from the range of 1 nm to 100 nm.

Figure 13:
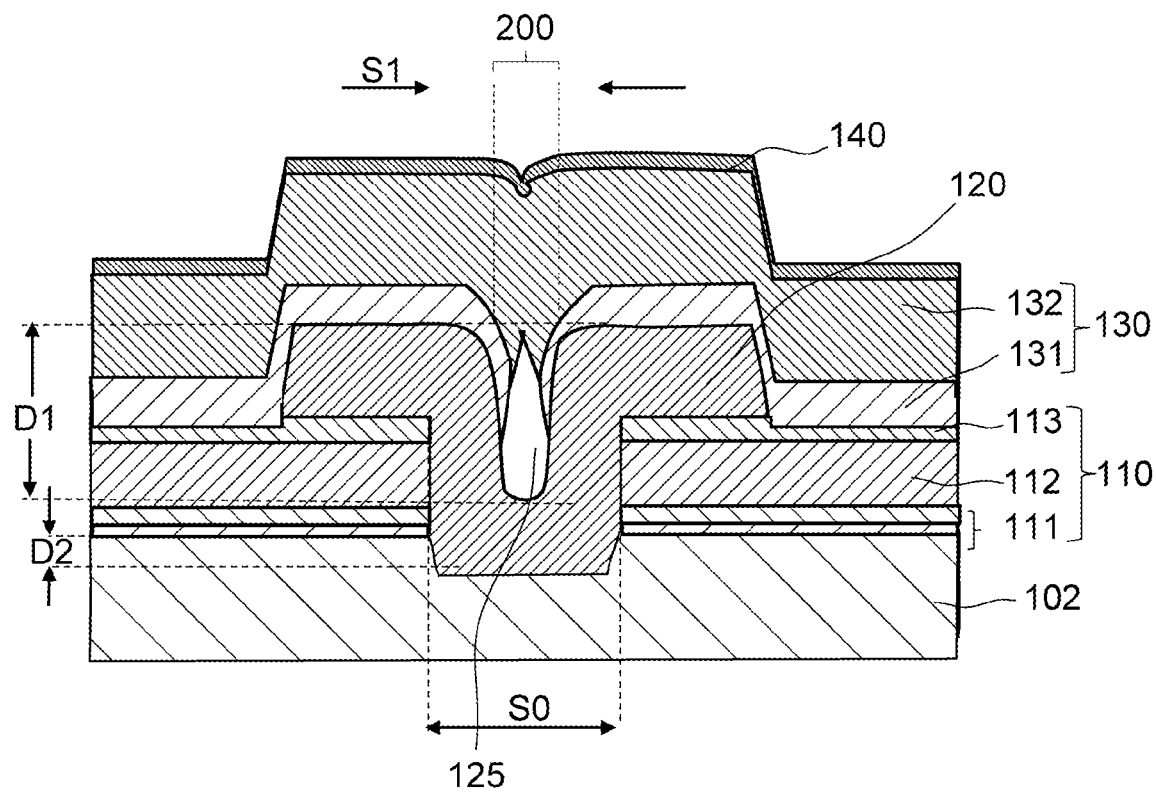
FIG. 13 is a sectional view of a pixel portion of an example of the display device according to the second embodiment.

As illustrated in FIG. 13, the cavity 125 is present in a space inside the recess 200 on the upper face of the second insulating layer 120 between the first electrodes 110. The film thickness of the organic layer 131 which is laminated over the second insulating layer 120 and has a low resistance becomes thinner along the depth direction of the recess 200 of the second insulating layer 120 on the inner wall surface of the recess 200. Preferably, the low-resistance organic layer 131 has a discontinuous part inside the recess 200.

On the other hand, part of the low-resistance organic layer 131 having a thicker film thickness than the inner wall surface of the recess 200 and the organic layer 132 disposed over the low-resistance organic layer 131 are laminated near the upper end of the recess 200 of the second insulating layer 120. When the distance between the adjacent first electrodes 110 is short, a width S1 of the recess 200 on the upper face of the second insulating layer 120 becomes small. Thus, the organic layer 130 disposed over the second insulating layer 120 does not extend along the recess 200, but is formed above the recess 200 with a cavity left inside the recess 200.

As a result, the organic layer 130 extends across the recess 200 of the second insulating layer 120 above the recess 200, and an opening of the recess 200 is closed by the organic layer 130 to form the cavity 125.

In this manner, it is possible to reduce the film thickness of the low-resistance organic layer 131 between the first electrodes 110 which are disposed adjacent to each other using the inside of the recess 200 on the upper face of the second insulating layer 120 to locally increase the resistance of the organic layer 131. The structure in which the cavity 125 is present inside the recess 200 is not limited to the case where the distance between the first electrodes 110 is short. As other cases, the depth of the recess 200 is deep due to the existence of a groove of the first insulating layer 102 which is formed at a position between the first electrodes 110, or the height of the adjacent first electrodes 110 is high.

Further, it is possible to prevent reduction in a separated distance between the first electrode 110 and the second electrode 140 caused by the recess 200 of the second insulating layer 120 by the existence of the cavity 125 between the first electrode 110 and the second electrode 140. Thus, it is possible to reduce or prevent an electric field intensity between the first electrode 110 and the second electrode 140 from locally increasing in the recess 200. Accordingly, it is possible to more effectively reduce leakage current in the inter-pixel direction.

The display device according to the present embodiment described above also includes the second insulating layer 120 which is continuous between the opposed ends of the adjacent first electrodes 110 from an upper part of one of the ends to an upper part of the other end. That is, the upper face of the first insulating layer 102 is covered with the second insulating layer and not in contact with the organic layer 131 between the first electrodes 110. Thus, it is possible to reduce or prevent leakage current flowing to the organic layer 131 through the interface between the first insulating layer 102 and the second insulating layer 120.

Third Example Embodiment

In the present embodiment, only a part that differs from the first and second embodiments will be described with reference to FIGS. 14 to 19B. Description for a configuration, a function, a material, and an effect that are similar to those of the first embodiment will be omitted.

Figure 14:
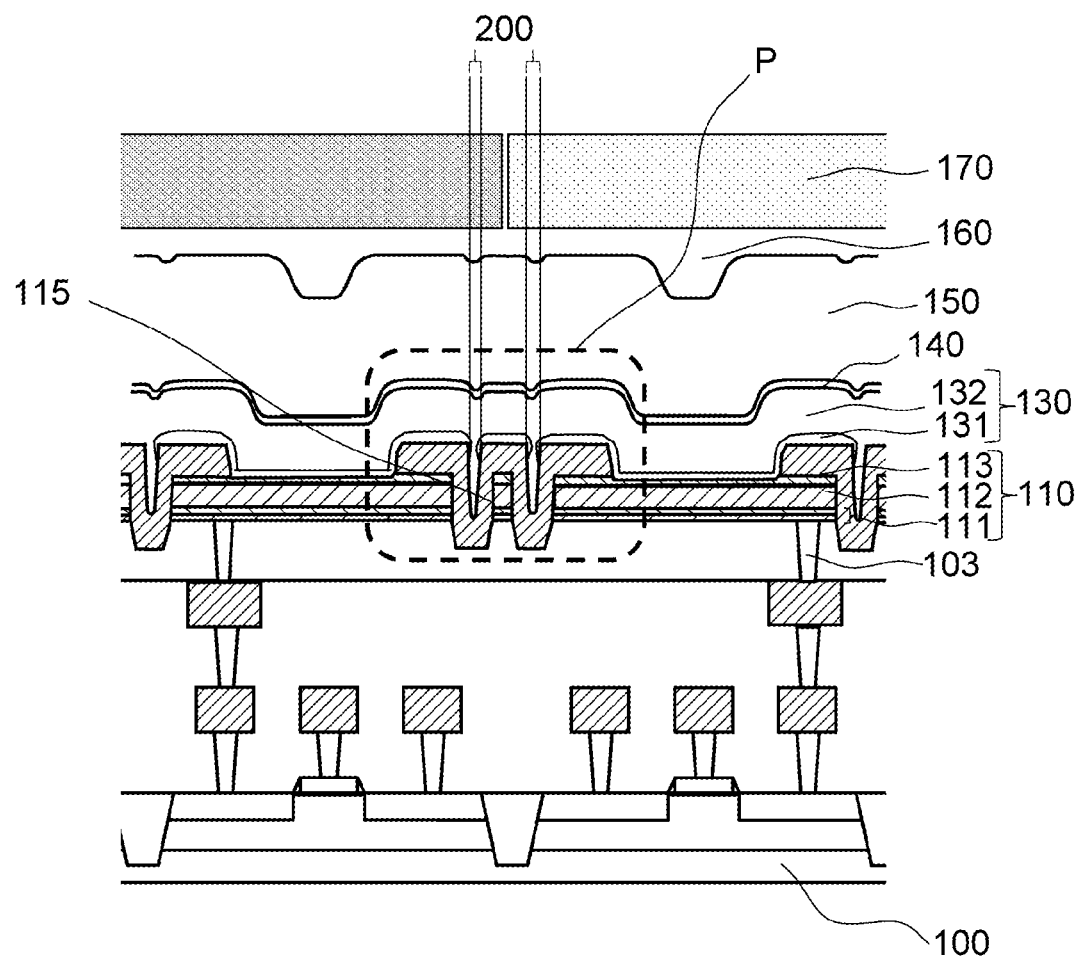
FIG. 14 is a sectional view of an organic light emitting element of an example of a display device according to a third embodiment.

FIG. 14 is a schematic sectional view of a part corresponding to line A-A' which extends across two adjacent sub-pixels in FIG. 2 described in the first embodiment. As illustrated in FIG. 14, each sub-pixel is provided with a first electrode 110. A voltage or a current applied to each first electrode 110 can be independently controlled. A conductive member 115 is disposed between adjacent first electrodes 110.

A voltage or a current applied to the conductive member 115 can be controlled independently of the first electrodes 110 which are adjacent to the conductive member 115. The conductive member 115 may have a common potential within a display region, or a plurality of conductive members 115 may be provided within the display region and controlled independently of each other.

The voltage applied to the conductive member 115 may be a constant voltage or may be modulated. Leakage current between adjacent pixels can be reduced by controlling the potential of the conductive member 115. Thus, for example, the voltage applied to the conductive member 115 has the same polarity as the first electrode 110 to reduce an electric field between the first electrode 110 and the conductive member 115. Accordingly, it is possible to reduce leakage current in the inter-pixel direction. The voltage that can be applied to the conductive member 115 is not limited to the above voltage, and may be set to any voltage.

The conductive member 115 may have a constant width within the display region or may have a plurality of widths. For example, the width of the conductive member 115 disposed between a sub-pixel R and a sub-pixel G may differ from the width of the conductive member 115 disposed between the sub-pixel R and a sub-pixel B. A plurality of conductive members 115 may be disposed between the first electrodes 110.

The conductive member 115 disposed between the first electrodes 110 may not be disposed on the center between the first electrodes 110. For example, when the influence of display deterioration caused by leakage current between pixels varies between sub-pixels, the layout of the conductive member 115 can be adjusted according to the degree of the influence.

As illustrated in FIG. 14, the conductive member 115 is disposed on the first insulating layer 102 between the adjacent first electrodes 110. The second insulating layer 120 covers the peripheries of the first electrodes 110 and the upper part of the conductive member 115.

The width of the conductive member 115 is preferably sufficiently narrower than the width of the first electrode 110 so as to increase an area occupancy of the first electrode within the display region.

The second insulating layer 120 covers an interface between the first electrode 110 and the first insulating layer 102 and an interface between the conductive member 115 and the first insulating layer 102. Specifically, the second insulating layer 120 is continuous between ends of the adjacent first electrodes 110, the ends being adjacent to each other with the conductive member 115 interposed therebetween, from an upper part of one of the ends to an upper part of the other end through the conductive member 115. The second insulating layer 120 covers the upper face and the side face of the end of each of the first electrodes 110 and the upper face and the side face of the conductive member 115.

The height of the second insulating layer 120 over the first electrode 110 may be substantially equal to the height of the second insulating layer 120 on the conductive member 115. Accordingly, it is possible to increase the aspect ratio of a recess 200 (described below) on the upper face of the second insulating layer 120 which covers the upper face and the side face of the end of each of the first electrodes 110 and the upper face and the side face of the conductive member 115. Thus, it is possible to easily reduce the film thickness of an organic layer 131 inside the recess 200 over the second insulating layer 120.

Note that these organic light emitting elements are protected by a moisture-proof layer 150 which is disposed over a second electrode 140. A color filter layer 170 is disposed over the moisture-proof layer 150.

Hereinbelow, the structure of each part will be described in detail.

The first electrodes 110 and the conductive member 115 are disposed on the first insulating layer 102. In FIG. 14, the conductive member 115 and the first electrodes 110 can be formed of the same material at the same time. The conductive member 115 may have a smaller reflectivity than a light emission region of the first electrode 110. Accordingly, it is possible to prevent deterioration of a display quality caused by unintentional light emitted from the display device due to stray light inside the display device reflected by the surface of the conductive member 115. For example, the film thickness of an injection efficiency adjusting layer 113 on the conductive member 115 may be thicker than the film thickness of the injection efficiency adjusting layer 113 in the light emission region of the first electrode 110. Further, a material capable of reducing reflection which is not included in the first electrode 110 may be disposed on the upper face of the conductive member 115 (not illustrated).

The conductive member 115 may be discontinuously disposed in the pixel region. When it is necessary to prevent a voltage drop in the pixel region, a plug which is connected to the conductive member 115 may be disposed within the pixel region. On the other hand, the first electrodes 110 can be arrayed with high density by disposing the plug connected to the conductive member 115 on the outer periphery of the pixel region in which the first electrodes 110 are arrayed.

The second insulating layer 120 covers the upper face and the side face of the end of each of the first electrodes 110. The second insulating layer 120 extends across the first electrode 110 and the first insulating layer 102, that is, covers the interface between the first electrode 110 and the first insulating layer 102. The second insulating layer 120 extends across the conductive member 115 and the first insulating layer 102, that is, covers the interface between the conductive member 115 and the first insulating layer 102. As a result, the upper face of the second insulating layer 120 includes the recess 200 between the first electrode 110 and the conductive member 115.

The inner wall surface of the recess 200 may be a continuous slope or may have a step. The inner wall surface of the recess 200 may have a forward tapered angle with respect to the substrate surface, or may have a backward tapered angle partially or entirely. An inclination angle of the inner wall surface of the recess 200 may vary between pixels having different emission colors.

In FIG. 14, the bottom of the recess 200 which is formed along the surface of the second insulating layer 120 has a part shallower than the bottom of the first electrode 110 between the first electrode 110 and the conductive member 115. Further, FIG. 14 illustrates an example in which, between the first electrode 110 and the conductive member 115, the height of the surface of first insulating layer 102 which serves as a base of the second insulating layer 120 is lower than the bottoms of the first electrode 110 and the conductive member 115 (forms a groove).

The depth of the upper face of the first insulating layer 102 between the first electrode 110 and the conductive member 115 may be deeper at least in a range where the second insulating layer 120 can cover the interface between the first electrode 110 and the first insulating layer 102. For example, the depth of the groove can be selected in any manner from the range of 1 nm to 100 nm. Accordingly, it is possible to increase the aspect ratio of the recess 200 on the upper face of the second insulating layer 120 which is formed on the groove.

Figure 15A:
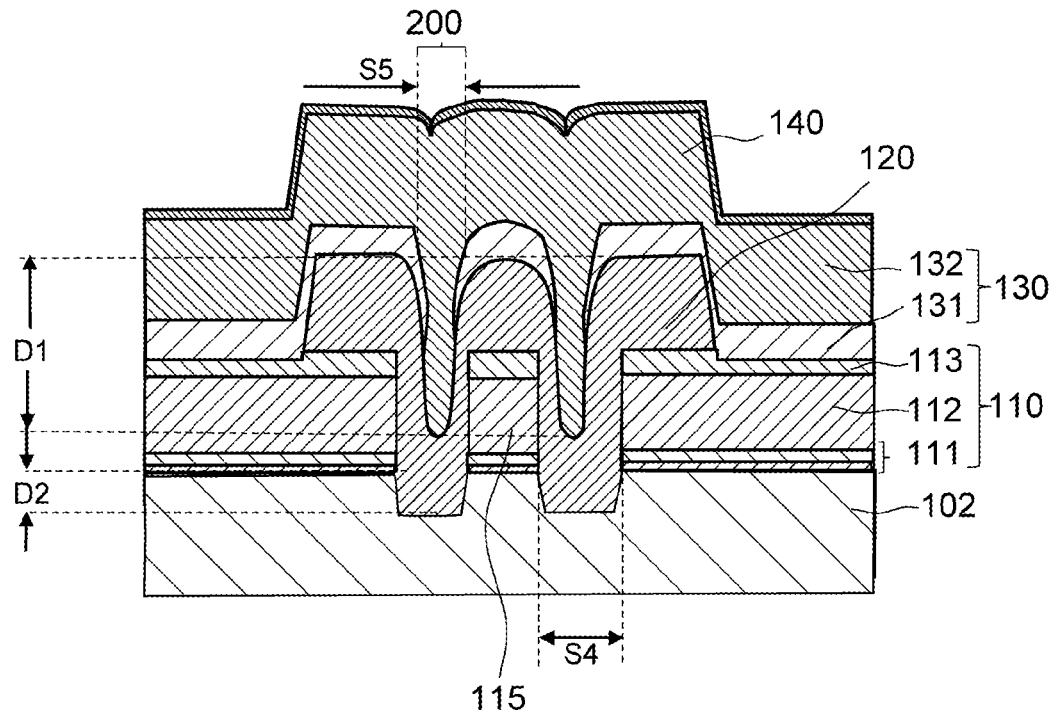
FIGS. 15A and 15B are sectional views of a pixel portion of an example of the display device according to the third embodiment.
Figure 15B:
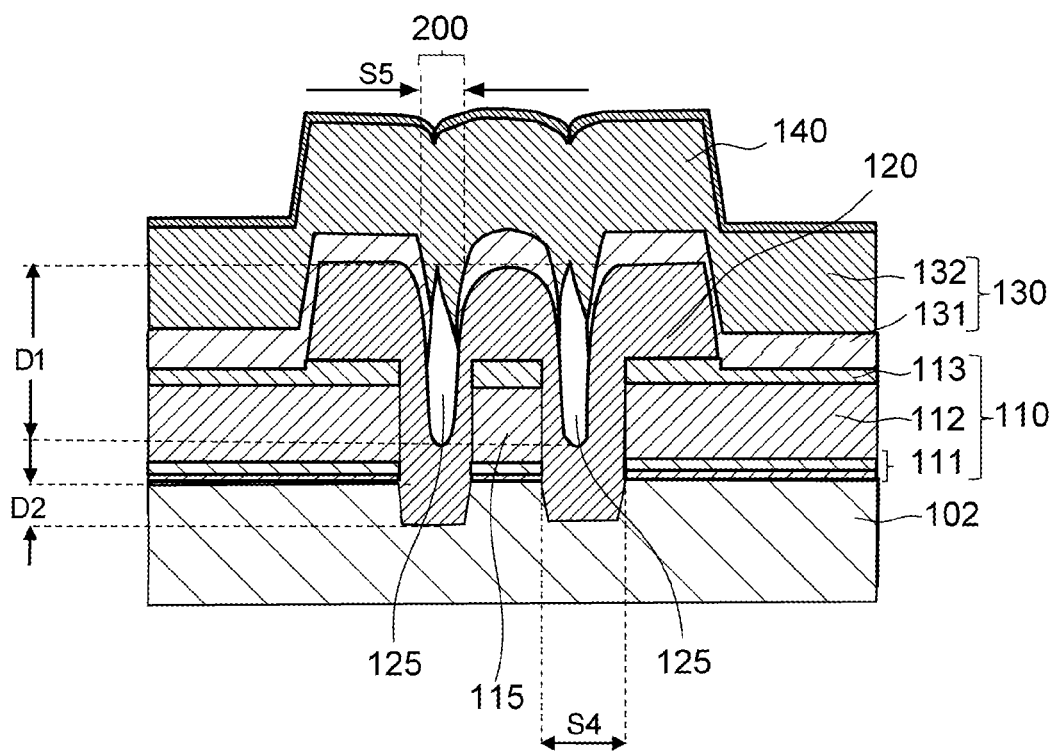

FIGS. 15A and 15B are enlarged schematic sectional views of a part between pixels according to FIG. 14. As illustrated in FIG. 15A, a space between the first electrode 110 and the conductive member 115 which are adjacent to each other has a width S4. A space between the inner walls of the recess 200 of the second insulating layer 120 has a width S5. A relationship (aspect ratio) between the depth D1 of the recess 200 on the upper face of the second insulating layer 120 and the width S5 of the space of the recess 200 preferably satisfies the relationship of Formula 1 described in the first embodiment.

For example, in the high-definition display device as described in the present embodiment, when the width S4 is 10 nm to 500 nm, the width S5 of the space of the recess 200 can be set in the range of 5 nm to 500 nm. It is possible to locally increase the resistance of the organic layer 131 having a low resistance between the first electrodes 110 which are disposed adjacent to each other using the inside of the recess 200 by setting the lower limit of the width S5 of the space between the inner walls of the recess 200 in this manner.

As illustrated in FIG. 15B, a cavity 125 may be formed in the organic layer 130 without filling the inside of the recess 200 on the upper face of the second insulating layer 120 between the first electrode 110 and the conductive member 115 with the organic layer 130. When the organic layer 130 has such a structure in which part of the organic layer 130 extends across the recess 200 of the second insulating layer 120, the film thickness of the low-resistance organic layer 131 can be appropriately reduced inside the recess 200 by the side face of the recess 200 having a backward tapered angle. The conductive member 115 may have a nonuniform line width in plan view.

Figure 16A:
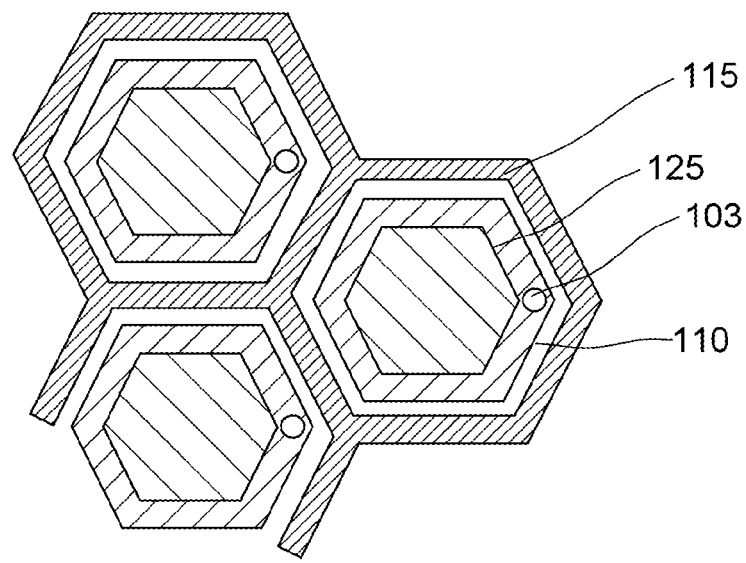
FIGS. 16A and 16B are plan views of a pixel region of an example of the display device according to the third embodiment.
Figure 16B:
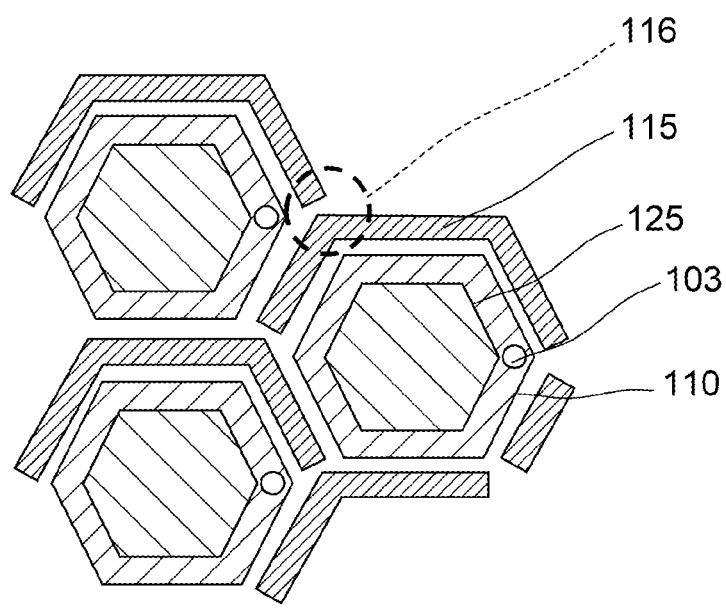

FIGS. 16A and 16B illustrate examples of a planar structure diagram of the conductive member 115 which is disposed between the first electrodes 110. The width and the length of the conductive member 115 can be set in any manner. For example, the conductive member 115 may be continuously arranged with a uniform width as illustrated in FIG. 15A or may be discontinuously arranged as illustrated in FIG. 15B.

The display device as described above can be manufactured, for example, in the following manner.

FIGS. 17A to 17C, 18A and 18B, and 19A and 19B illustrate an example of a manufacturing process for the display device according to the present embodiment.

Figure 17A:
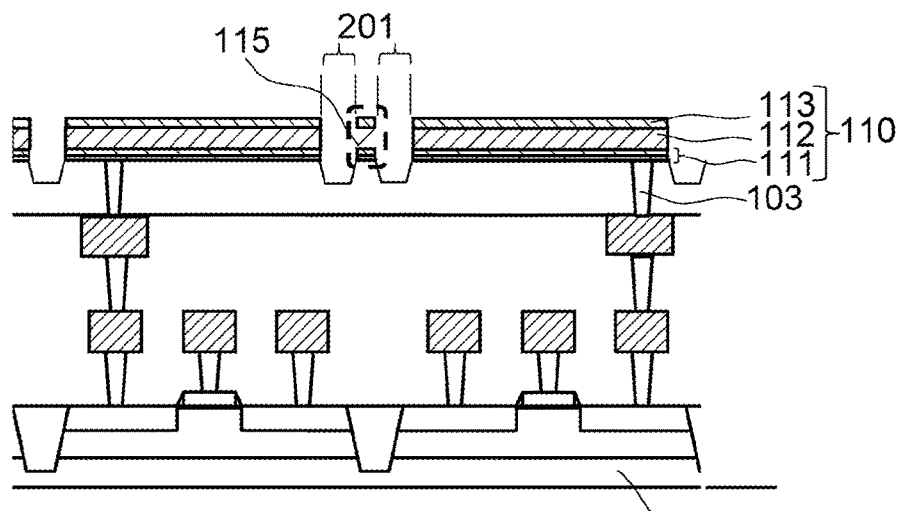
FIGS. 17A to 17C are manufacturing process flow diagrams of an example of the display device according to the third embodiment.

As illustrated in FIG. 17A, a laminated metal film is formed on the first insulating layer 102 in a manner similar to the first embodiment and patterned into a predetermined shape by a photolithography method and a dry etching method or a wet etching method. Accordingly, a plurality of first electrodes 110 which are connected to the respective plugs 103 and the conductive member 115 are formed in the display region at the same time. It is possible to increase the accuracy of the relative distance between the recess of the second insulating layer 120 formed in the next process and the first electrodes 110 by forming the first electrodes 110 and the conductive member 115 at the same time.

The surface of the first insulating layer 102 between the first electrode 110 and the conductive member 115 is etched so that the surface is located at a position deeper than the bottoms of the first electrode 110 and the conductive member 115 (deeper as closer to the substrate from the surface of the first insulating layer 102). The first electrodes 110 and the first insulating layer 102 may be separately etched or collectively etched. It is possible to accurately align the side face position of the first electrode 110 with the position of the recess (groove) of the first insulating layer 102 by collectively etching the first electrodes 110 and the first insulating layer 102. Accordingly, a desire recess (groove) can be formed on the first insulating layer 102 also between the first electrodes 110 which are arrayed with high density.

For example, the depth of the recess 201 of the first insulating layer 102 can be selected in any manner from the range of 1 nm to 100 nm. However, the depth of the recess 201 of the first insulating layer 102 described herein is not limited to the above range, and may be any depth. The depth of the recess 200 on the upper face of the second insulating layer 120, which is formed in the next process, can be increased by increasing the depth of the recess 201. Thus, it is possible to increase the aspect ratio of the recess 200.

Further, an etching stop layer may be additionally formed at the depth of the bottom of the recess 201 of the first insulating layer 102 to make the depth of the recess 201 of the first insulating layer 102 uniform between recesses 201 within the display region (not illustrated).

The etching stop layer preferably has a high etching selectivity ratio with the first insulating layer 102. For example, when the first insulating layer 102 is a silicon oxide film, a silicon nitride film can be preferably used as the etching stop layer. Alternatively, a light shielding layer made of a metal material such as titanium (Ti) or titanium nitride (TiN) can also be used as the etching stop layer.

Figure 17B:
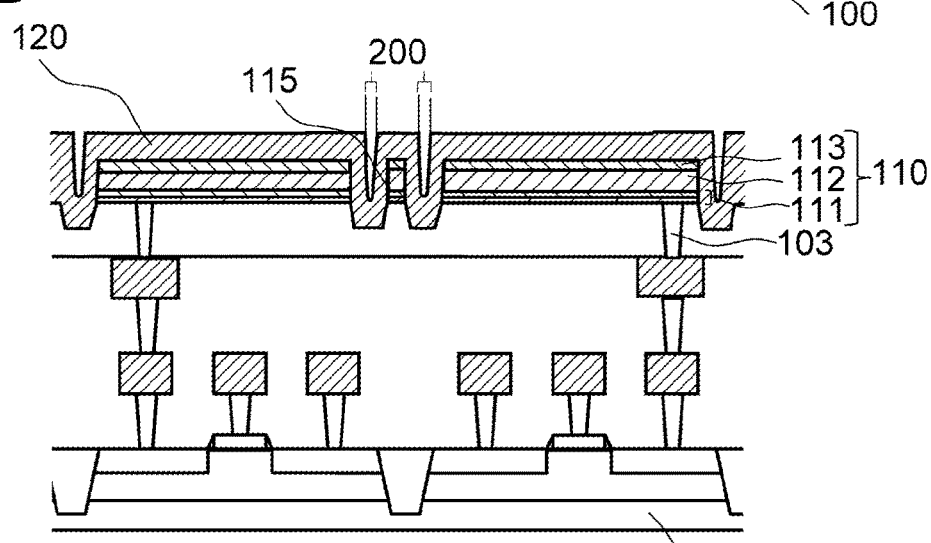

Next, as illustrated in FIG. 17B, an insulating layer such as an oxide film, an oxynitride film, or a silicon nitride film is formed on the first insulating layer 102 on which the first electrodes 110 are arrayed by a plasma CVD method to form the second insulating layer 120. For example, when each of the first electrodes 110 includes a layer including an aluminum alloy as a reflective metal layer, a film forming temperature of the second insulating layer 120 which is deposited on the first electrodes 110 is preferably 400° C. or less in order to prevent variations in the surface roughness of the aluminum alloy.

The second insulating layer 120 which covers, between the first electrodes 110, the upper face and the side face of the end of each of the first electrodes 110, the upper face and the side face of the conductive member 115, and the upper face of the first insulating layer 102 including the recess 201 includes a plurality of recesses 200 on the upper face thereof. The film thickness of the second insulating layer 120 on the side faces of the first electrode 110 and the conductive member 115 can be made substantially uniform by forming the recesses 200 in this manner. That is, the recesses 200 can be formed between the first electrodes 110 by self-alignment (with high position accuracy). Thus, it is possible to substantially uniformly and effectively reduce leakage current between pixels within the display region surface.

The thickness of the second insulating layer 120 may be any value in the range of 1 nm to 500 nm. For example, the thickness of the second insulating layer 120 can be selected so that the recess 200 which is formed along the surface of the second insulating layer 120 has a desired width or a desired depth.

With such a structure and method, the recess 200 can be formed on the upper face of a part of the second insulating layer 120 on which the organic layer 131 is disposed by forming the second insulating layer 120 along the recess formed between the adjacent first electrodes 110. Accordingly, it is possible to form the recess 200 which has a smaller distance between inner walls than the recess between the first electrode 110 and the conductive member 115 which is formed by etching the first electrode 110 and the conductive member 115 and etching the first insulating layer 102.

This is advantageous in locally reducing the film thickness of the organic layer 131 inside the recess 200 in a film forming process for the organic layer 131 described below.

A maximum step on the surface of the second insulating layer 120 on the substrate is preferably the recess 200 between the first electrodes 110 described above. That is, the distance between the bottom of the recess 200 and the upper face of the periphery of the recess 200 of the second insulating layer 120 is preferably larger than the difference between another recess and another projection on the upper face of the second insulating layer 120. In this case, the upper end of the recess 200 of the second insulating layer 120 is preferably located at the same height as the uppermost face of the second insulating layer 120.

Accordingly, the second electrode 140 and the moisture-proof layer 150 which are formed in the next or subsequent processes may be formed taking into consideration a coverage property with respect to a minimum step required to reduce leakage between pixels. Thus, it is possible to easily secure a coverage margin of each of the layers. Accordingly, since a defect of the second electrode 140 and the moisture-proof layer 150 can be reduced, it is possible to prevent deterioration of the display performance.

The film forming method for the second insulating layer 120 is not limited to the above method. A known method that forms an insulating layer can be applied in any manner. For example, as a method other than the above method, a high-density plasma CVD method, an ALD method, a sputtering method, or a method by applying a coating material by a spin coat method or a slit coat method may be selected. The second insulating layer 120 may be formed by laminating a plurality of layers.

Figure 17C:
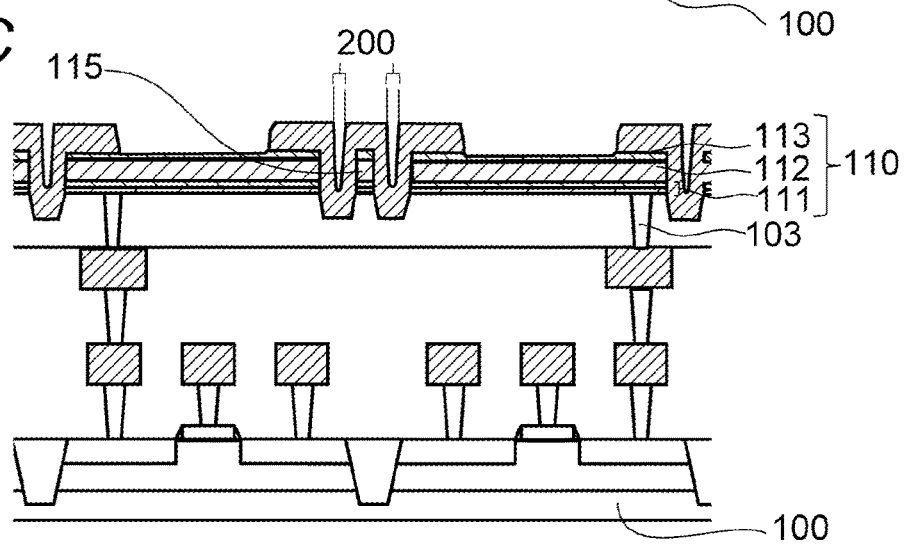
Figure 18A:
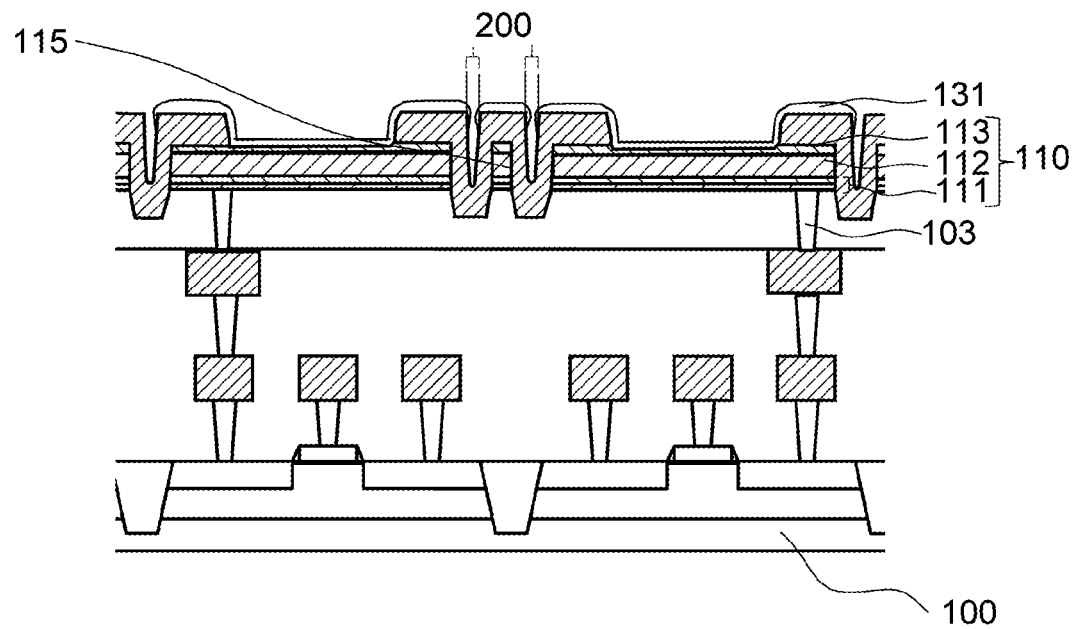
FIGS. 18A and 18B are manufacturing process flow diagrams of an example of the display device according to the third embodiment.
Figure 18B:
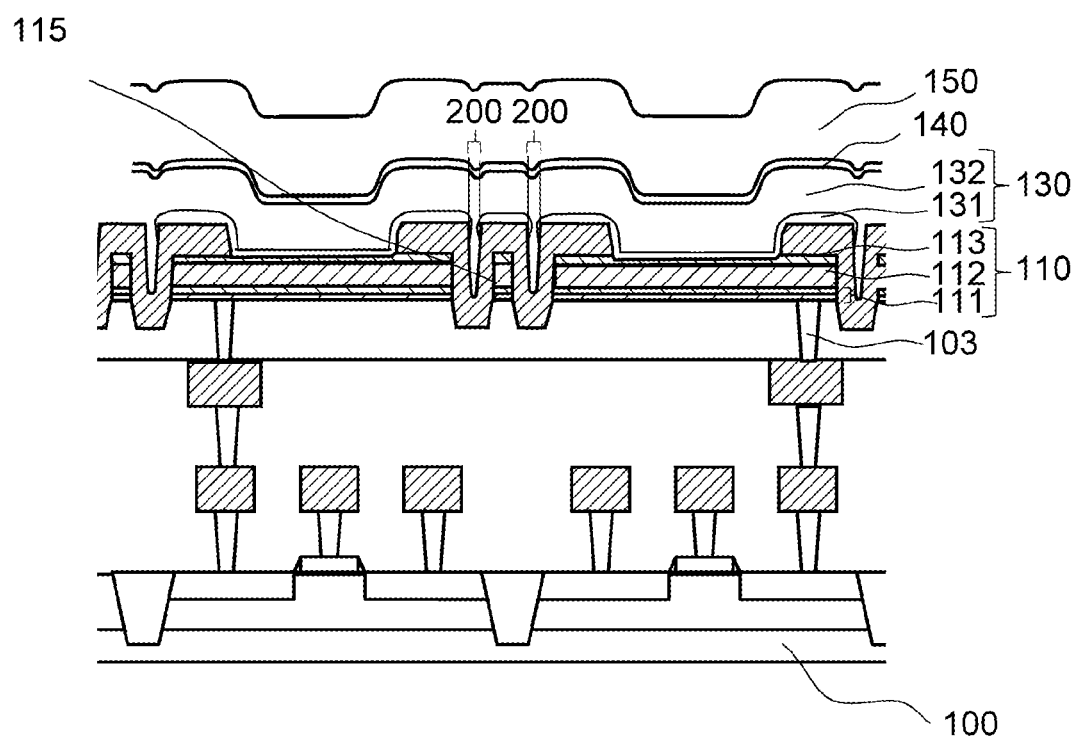

Next, as illustrated in FIG. 17C, the second insulating layer 120 is patterned into a predetermined shape by a photolithography method and a dry etching method to form corresponding openings over the first electrodes 110. At the same time, an opening for connecting the second electrode 140, which is formed in the later process, to the metal layer which is the same layer as the first electrode 110 may also be formed.

Next, cleaning is performed to remove a foreign substance on the second insulating layer 120 and the first electrodes 110 before formation of the organic layer 131 in the next process. After the cleaning process, dehydration is performed to remove moisture on the surface of the substrate. Thereafter, in a manner similar to the first embodiment, the display device according to the present embodiment can be formed as illustrated in FIGS. 18A and 18B and 19A and 19B.

Figure 19A:
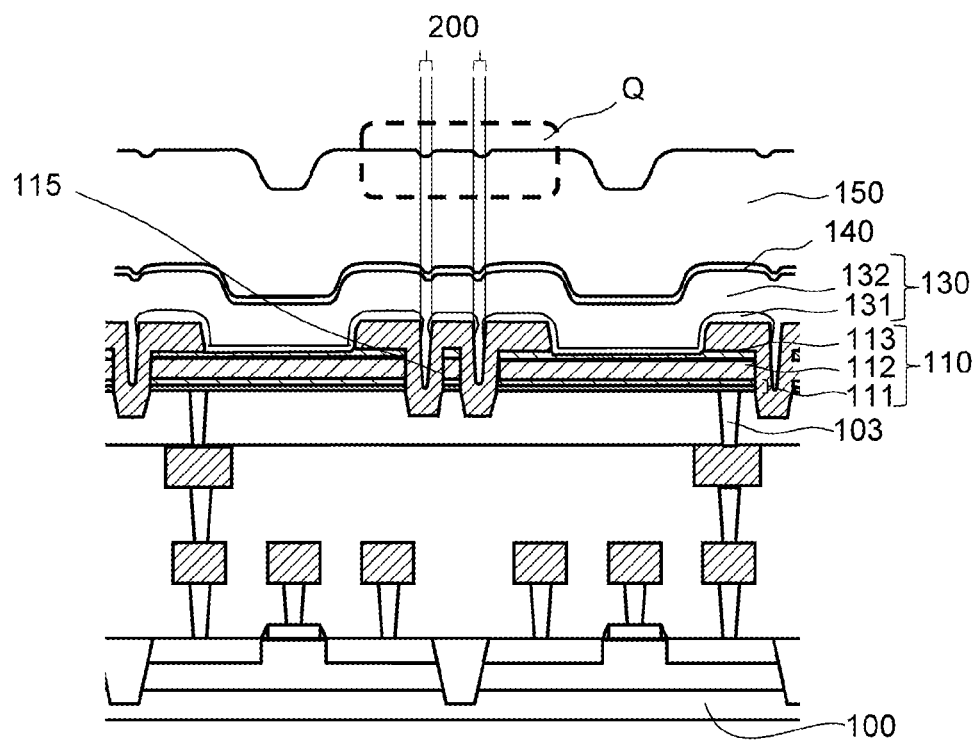
FIGS. 19A and 19B are manufacturing process flow diagrams of an example of the display device according to the third embodiment.
Figure 19B:
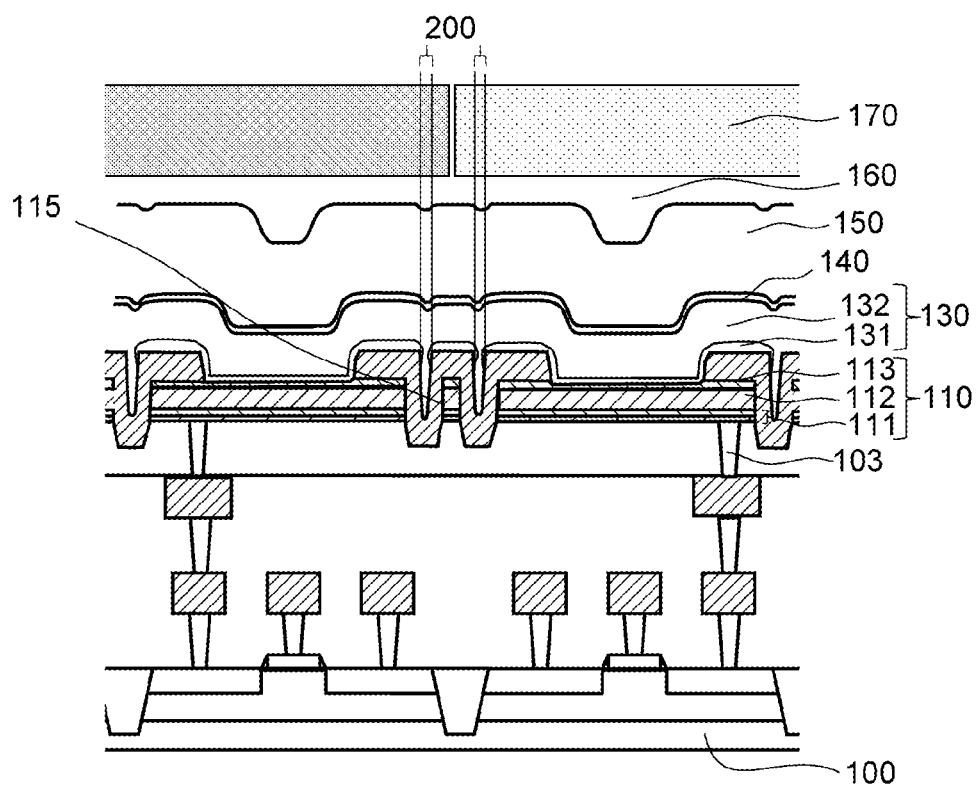

As indicated by a region Q surrounded by a broken line in FIG. 19A, in the present embodiment, it is possible to reduce the roughness of the moisture-proof layer 150 above the recess 200 of the second insulating layer 120. Thus, it is possible to reduce a defect in the moisture-proof layer 150. Further, in the course of light emitted from the light emitting region on the first electrode 110 passing through the moisture-proof layer 150, it is possible to reduce color mixture caused by complicated reflection of the light due to the roughness on the surface of the moisture-proof layer 150.

According to the present embodiment, it is possible to form the recess 200 having a smaller width than that in the first and second embodiments on the second insulating layer 120 with a high aspect ratio by disposing the conductive member 115 between the adjacent first electrodes 110. The conductive member 115 and the first electrodes 110 can be collectively formed in the same layer. Thus, it is possible to increase the accuracy of position alignment between the first electrodes 110 and the recesses 200.

Further, the potential of the conductive member 115 can be controlled independently of the first electrodes 110. Accordingly, it is possible to further reduce leakage current by adjusting a potential gradient between the first electrodes 110.

According to the above embodiment, it is possible to effectively reduce leakage between pixels in the high-definition display device.

Fourth Example Embodiment

Figure 20A:
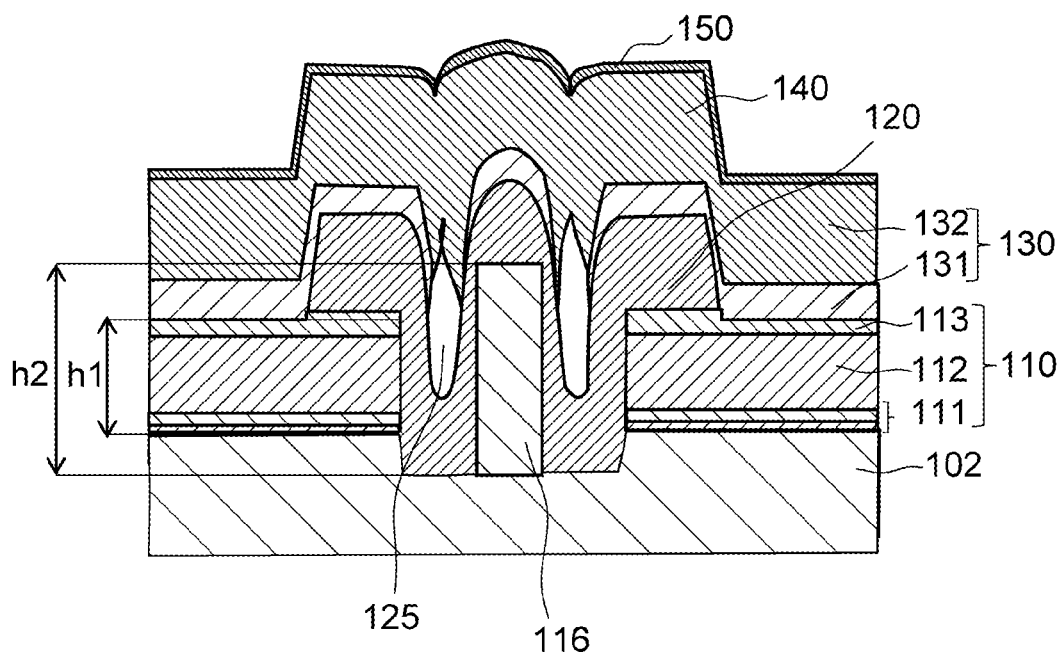
FIGS. 20A and 20B are sectional views of a pixel region of an example of a display device according to a fourth embodiment.
Figure 20B:
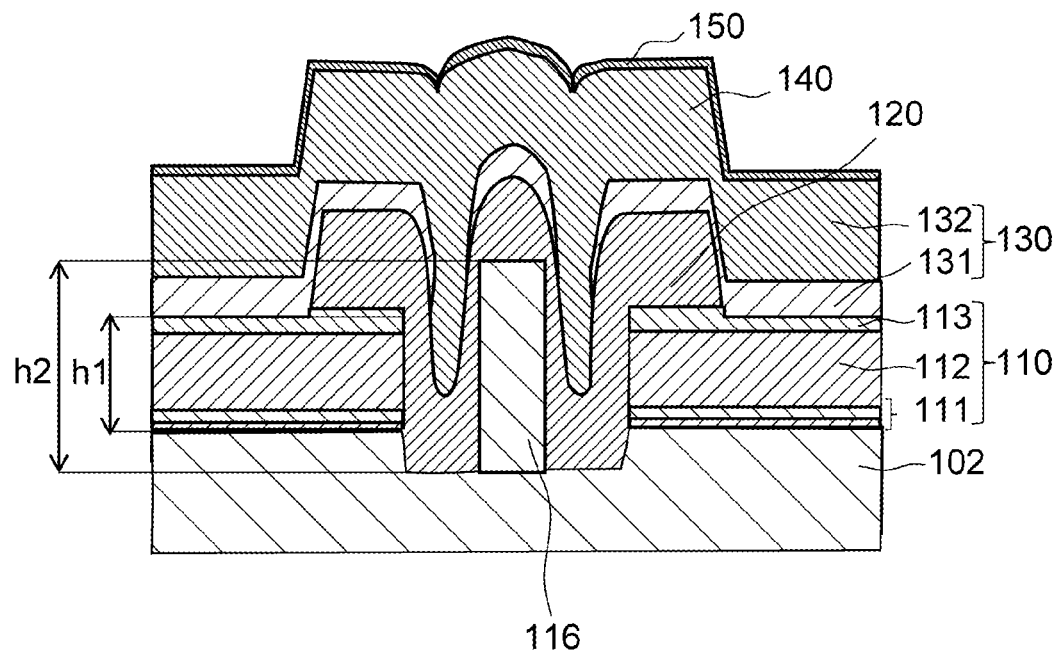

As illustrated in FIGS. 20A and 20B, as a modification of the third embodiment, an insulating member 116 may be provided instead of the conductive member 115. Thus, only a part that differs from the third embodiment will be described. Description for a configuration, a function, a material, and an effect that are similar to those of the third embodiment will be omitted.

The insulating member 116 is formed in a separate process from the first electrodes 110. Thus, the height of the insulating member 116 can be set independently of the first electrodes 110. For example, it is possible to effectively reduce leakage current between pixels by making a height h2 of the insulating member 116 higher than a height h1 of the first electrodes 110.

Fifth Example Embodiment

Figure 22:
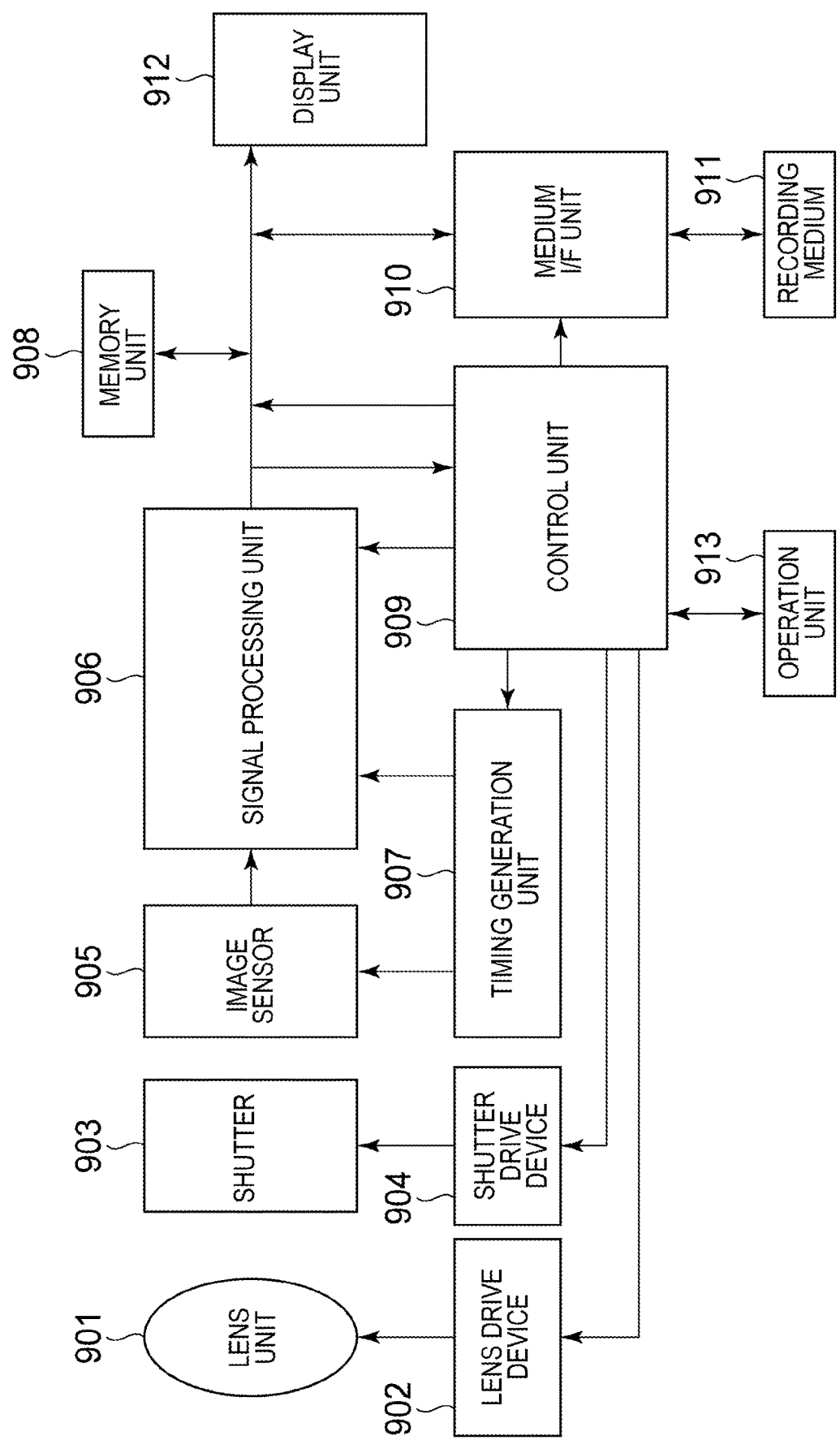
FIG. 22 is a diagram describing an example of an electronic apparatus according to a fifth embodiment.

In the present embodiment, an example in which the display device described in each of the first to fourth embodiments is applied to an electronic apparatus will be described with reference to FIG. 22.

An embodiment in which the above display device is applied to a digital camera which is an imaging apparatus as an example of an electronic apparatus will be described with reference to FIG. 22. A lens unit 901 is an imaging optical system which forms an optical image of a subject on an image sensor 905. The lens unit 901 includes a focusing lens, a variable power lens, and a diaphragm. Driving of a focusing lens position, a variable power lens position, and an opening diameter of the diaphragm is controlled by a control unit 909 through a lens drive device 902.

A mechanical shutter 903 is disposed between the lens unit 901 and the image sensor 905. Driving of the mechanical shutter 903 is controlled by the control unit 909 through a shutter drive device 904. The image sensor 905 is disposed in such a manner that light from the lens enters the image sensor 905. The image sensor 905 converts an optical image formed by the lens unit 901 with a plurality of pixels to an image signal.

An image signal output from the image sensor 905 is input to a signal processing unit 906. The signal processing unit 906 performs A/D conversion, demosaicing, white balance adjustment, and coding on the image signal. The signal processing unit 906 also performs focus detection which detects a de-focusing amount and a direction by a phase difference detecting method on the basis of a signal obtained from the image signal output from the image sensor 905.

A timing generation unit 907 outputs various timing signals to the image sensor 905 and the signal processing unit 906. The control unit 909 includes, for example, memories (ROM, RAM) and a microprocessor (CPU). The control unit 909 loads a program stored in the ROM to the RAM and controls each unit by executing the loaded program by the CPU to implement various functions of the digital camera. The functions implemented by the control unit 909 include automatic focus detection (AF) and automatic exposure control (AE). A signal based on a signal output from the image sensor 905 is input to the control unit 909. Further, a signal for an electronic viewfinder is input to a display unit 912.

A memory unit 908 is used by the control unit 909 and the signal processing unit 906 for temporarily storing image data or used as a work area. A medium I/F unit 910 is an interface for reading and writing a recording medium 911 which is, for example, a detachable memory card. The display unit 912 is used for displaying a captured image and various pieces of information of the digital camera. An operation unit 913 is a user interface which is used by a user for performing instruction and setting to the digital camera, such as a power switch, a release button, and a menu button.

It is possible to reduce color mixture and improve the efficiency by using the display device described in any of the first to fourth embodiments as the display unit 912. Thus, it is possible to provide an imaging apparatus with a higher definition or a reduced power consumption.

An operation of the digital camera during shooting will be described. When power is turned on, the digital camera is brought into a shooting standby state. The control unit 909 starts a video shooting process and a display process for causing the display unit 912 to act as the electronic viewfinder. When a shooting preparation command (e.g., a half press of the release button of the operation unit 913) is input in the shooting standby state, the control unit 909 starts focus detection. For example, the control unit 909 can perform the focus detection by a phase difference detection method. Specifically, an image misalignment amount is obtained on the basis of a phase difference in a signal waveform formed by combining an A image signal and a B image signal of the same type obtained from a plurality of pixels to obtain a de-focusing amount and a direction.

Then, the control unit 909 obtains a moving amount and a moving direction of the focusing lens of the lens unit 901 from the obtained de-focusing amount and direction, and drives the focusing lens through the lens drive device 902 to adjust a focus of the imaging optical system. After the driving of the focusing lens, focus detection based on a contrast evaluation value may be further performed as needed to finely adjust the focusing lens position.

Then, when a shooting start command (e.g., a full press of the release button) is input, the control unit 909 executes a shooting operation for recording, processes obtained image data by the signal processing unit 906, and stores the processed image data in the memory unit 908. Then, the control unit 909 records the image data stored in the memory unit 908 in the recording medium 911 through the medium I/F unit 910. The image data may be output to an external apparatus such as a computer through an external I/F unit (not illustrated).

The electronic apparatus is not limited to the imaging apparatus. The display device according to any of the first to fourth embodiments may be used as a display unit of various electronic apparatuses such as a mobile phone, a game machine, a smart watch, a television, a commercial large display, and a personal computer display.

One aspect of the disclosure is capable of, in a display device that includes a plurality of light emitting elements arrayed on an insulating layer and an insulating layer disposed between adjacent light emitting elements, reducing leakage current through the interface between the insulating layers.

While the disclosure has been described with reference to example embodiments, it is to be understood that the disclosure is not limited to the disclosed example embodiments. The scope of the following claims is to be accorded the broadest interpretation so as to encompass all such modifications and equivalent structures and functions.

What is claimed is:

1. A light emitting device comprising:
   a substrate;
   a drive circuit layer including a first transistor, a second transistor, and an isolation region disposed between the first transistor and the second transistor;
   a first insulating layer including a main surface and disposed on the drive circuit layer;
   a first lower electrode and a second lower electrode, both disposed on the main surface of the first insulating layer;
   a second insulating layer disposed between the first lower electrode and the second lower electrode, on an end of the first lower electrode, and on an end of the second lower electrode;
   an organic layer disposed on the first lower electrode, the second insulating layer, and the second lower electrode; and
   an upper electrode disposed on the organic layer,
   wherein each of the first transistor, the second transistor, and the isolation region is formed inside the substrate,
   wherein the second insulating layer includes a first part located on the end of the first lower electrode, a second part located on the end of the second lower electrode, and a third part continuous from the first part to the second part, and
   wherein, in a planar view from a first direction which is perpendicular to the main surface, the third part of the second insulating layer and the isolation region are overlapped.

2. The light emitting device according to claim 1, wherein an upper face of the third part of the second insulating layer includes a first recess between the first lower electrode and the second lower electrode, and
   wherein, in the planar view from the first direction, the first recess and the isolation region are overlapped.

3. The light emitting device according to claim 1, wherein the first insulating layer includes a second recess in a region between the first lower electrode and the second lower electrode on the first insulating layer.

4. The light emitting device according to claim 3, wherein, in the planar view from the first direction, the second recess and the isolation region are overlapped.

5. The light emitting device according to claim 2, wherein a length of the first recess in the first direction is 0.5 times or more a length of the first recess in a second direction perpendicular to the first direction.

6. The light emitting device according to claim 2, wherein a length of the first recess in the first direction is longer than a length of the first recess in a second direction perpendicular to the first direction.

7. The light emitting device according to claim 2, wherein the first insulating layer includes a plurality of recesses.

8. A light emitting device comprising:
   a substrate;
   a drive circuit layer including a first transistor, a second transistor, and an isolation region disposed between the first transistor and the second transistor;
   a first insulating layer including a main surface and disposed on the drive circuit layer;
   a first lower electrode and a second lower electrode, both disposed on the main surface of the first insulating layer;
   a second insulating layer disposed between the first lower electrode and the second lower electrode, on an end of the first lower electrode, and on an end of the second lower electrode;
   an organic layer disposed on the first lower electrode, the second insulating layer, and the second lower electrode;
   an upper electrode disposed on the organic layer; and
   a cavity disposed over the second insulating layer and disposed under the upper electrode,
   wherein each of the first transistor, the second transistor, and the isolation region is formed inside the substrate, and
   wherein, in a planar view from a first direction which is perpendicular to the main surface, the cavity is disposed between the first lower electrode and the second lower electrode, and the cavity and the isolation region are overlapped.

9. The light emitting device according to claim 8, wherein the first insulating layer includes a recess in a region between the first lower electrode and the second lower electrode on the first insulating layer.

10. The light emitting device according to claim 8, wherein the first insulating layer includes a plurality of recesses.

11. The light emitting device according to claim 1, further comprising a conductive member disposed between the first insulating layer and the second insulating layer,
    wherein, in the planar view from the first direction, the conductive member is disposed between the first lower electrode and the second lower electrode.

12. The light emitting device according to claim 11, wherein the conductive member includes the same material as the first lower electrode and the second lower electrode.

13. The light emitting device according to claim 2, wherein a film thickness of the organic layer inside the first recess is smaller than a film thickness of the organic layer on the second insulating layer.

14. The light emitting device according to claim 1, wherein the first insulating layer is disposed on the substrate, and the substrate is opaque.

15. An electronic apparatus comprising:
the light emitting device according to claim 1; and
a control unit configured to input a signal to the light emitting device.

16. An electronic apparatus comprising:
the light emitting device according to claim 8; and
a control unit configured to input a signal to the light emitting device.

17. The light emitting device according to claim 1, wherein at least a part of each of the first transistor and the second transistor is formed inside the substrate.

18. The light emitting device according to claim 8, wherein at least a part of each of the first transistor and the second transistor is formed inside the substrate.

19. The light emitting device according to claim 1, wherein each of the first transistor and the second transistor is a metal-oxide-silicon (MOS) transistor.

20. The light emitting device according to claim 8, wherein each of the first transistor and the second transistor is a metal-oxide-silicon (MOS) transistor.

* * * * *